United States Patent [19]
Sakamoto et al.

[11] Patent Number: 5,489,802
[45] Date of Patent: Feb. 6, 1996

[54] PRESSURE CONTACT TYPE SEMICONDUCTOR DEVICE AND HEAT COMPENSATOR

[75] Inventors: Tokumitsu Sakamoto; Yuzuru Konishi, both of Fukuoka, Japan

[73] Assignee: Mitsubishi Denki Kabushiki Kaisha, Tokyo, Japan

[21] Appl. No.: 77,761

[22] Filed: Jun. 18, 1993

[30] Foreign Application Priority Data

Jun. 26, 1992 [JP] Japan .................. 4-169357

[51] Int. Cl.⁶ .............................. H01L 23/02; H02B 1/04
[52] U.S. Cl. ............... 257/688; 257/689; 257/712; 257/713; 257/718; 257/719; 361/707; 361/714
[58] Field of Search .................... 257/688, 689, 257/690, 127, 147, 718, 719, 796, 712, 713; 361/679, 704, 707, 714

[56] References Cited

U.S. PATENT DOCUMENTS

| | | |
|---|---|---|
| 3,992,717 | 11/1976 | Rice . |
| 5,047,836 | 9/1991 | Tokunoh . |
| 5,117,281 | 5/1992 | Katsuraka ........................... 257/712 |

FOREIGN PATENT DOCUMENTS

| | | | |
|---|---|---|---|
| 6610869 | 5/1979 | Germany . | |
| 2805771 | 8/1979 | Germany .......................... 257/719 |
| 55-91151 | 4/1980 | Japan . | |
| 55-78535 | 6/1980 | Japan ................................... 257/688 |
| 57175435 | 7/1992 | Japan . | |

OTHER PUBLICATIONS

Patent Abstracts of Japan, vol. 13, No. 413, E–820, Sep. 12, 1989, JP 1–152668, Jun. 15, 1989.

Patent Abstracts of Japan, vol. 14, No. 401, E–971, Aug. 30, 1990, JP 2–151069, Jun. 11, 1990.

*Primary Examiner*—Sara W. Crane
*Assistant Examiner*—Carl Whitehead, Jr.
*Attorney, Agent, or Firm*—Oblon, Spivak, McClelland, Maier & Neustadt

[57] ABSTRACT

A semiconductor substrate (2) is pressed against heat compensators (6, 31) for electrical contact therewith without brazing. Silicone rubber (32) fixes the outer peripheral edge of the semiconductor substrate (2) and its adjacent portion on the heat compensator (31), preventing position shifts of the semiconductor substrate (2) without thermal distortion and, accordingly, preventing damages to the semiconductor substrate (2). The absence of thermal distortion, spikes, voids due to brazing permits the prevention of electrical characteristic deterioration.

25 Claims, 16 Drawing Sheets

F I G. 5
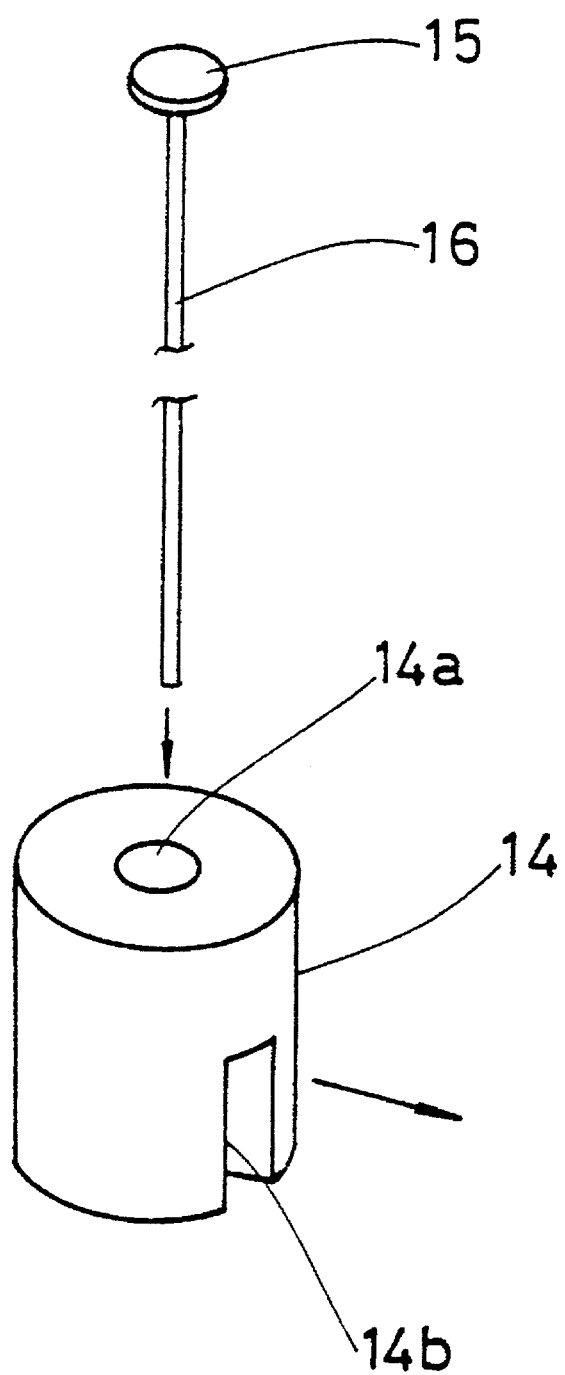

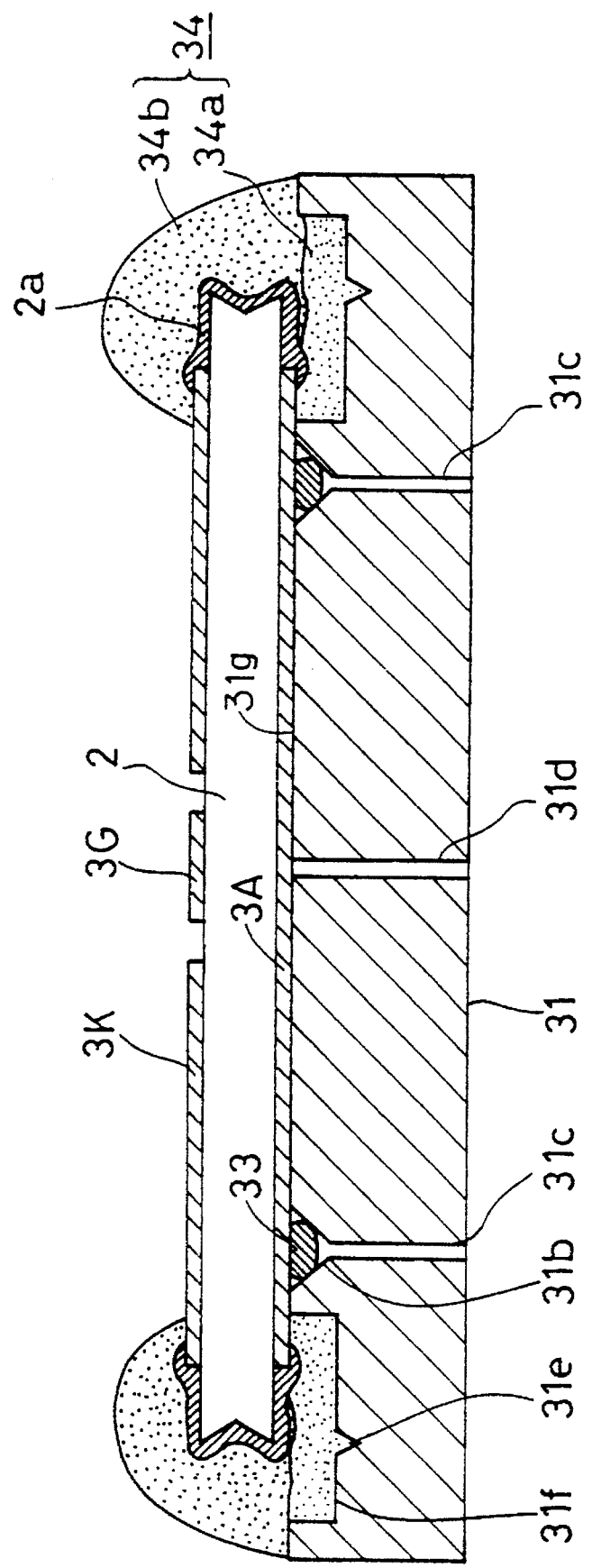

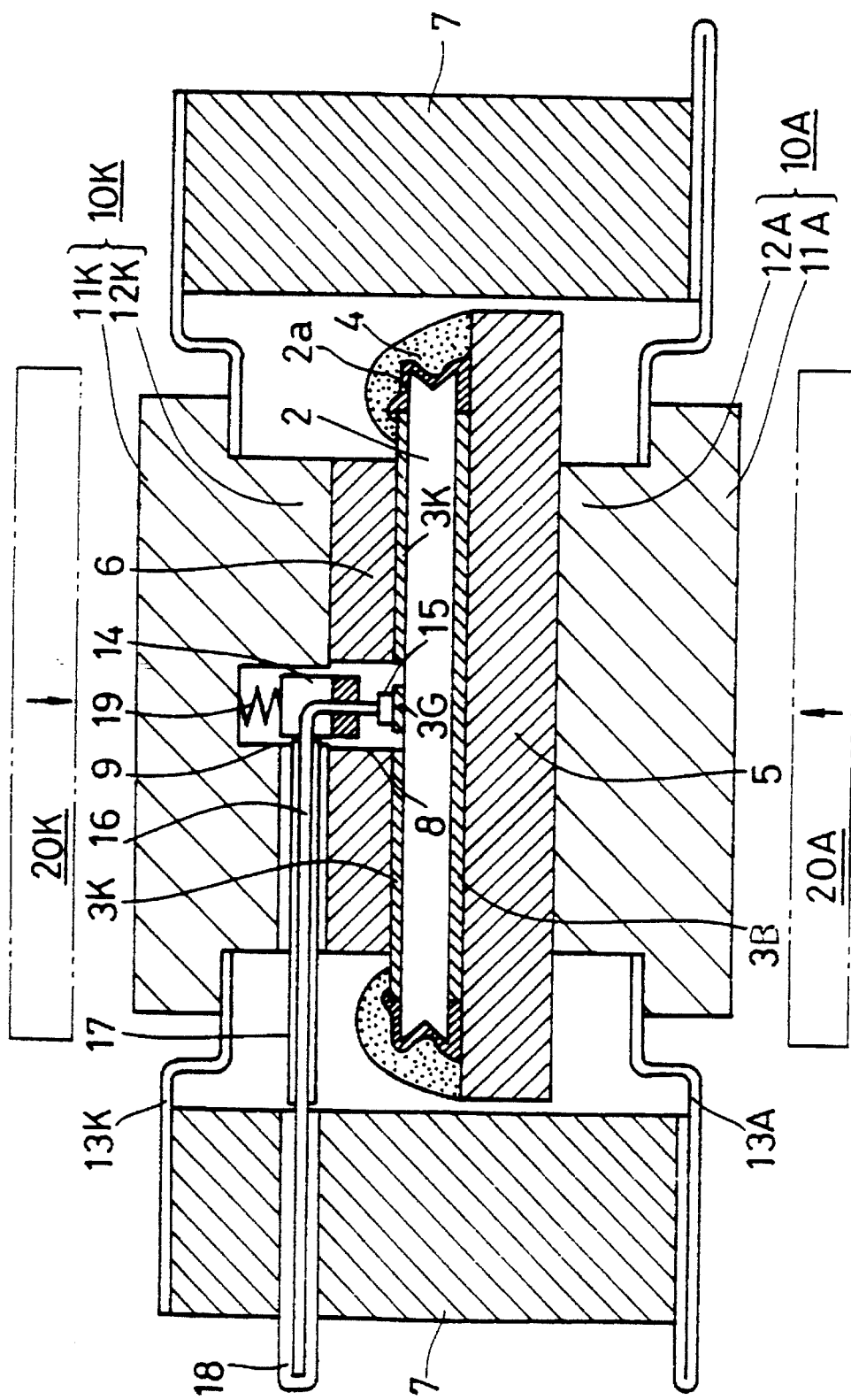

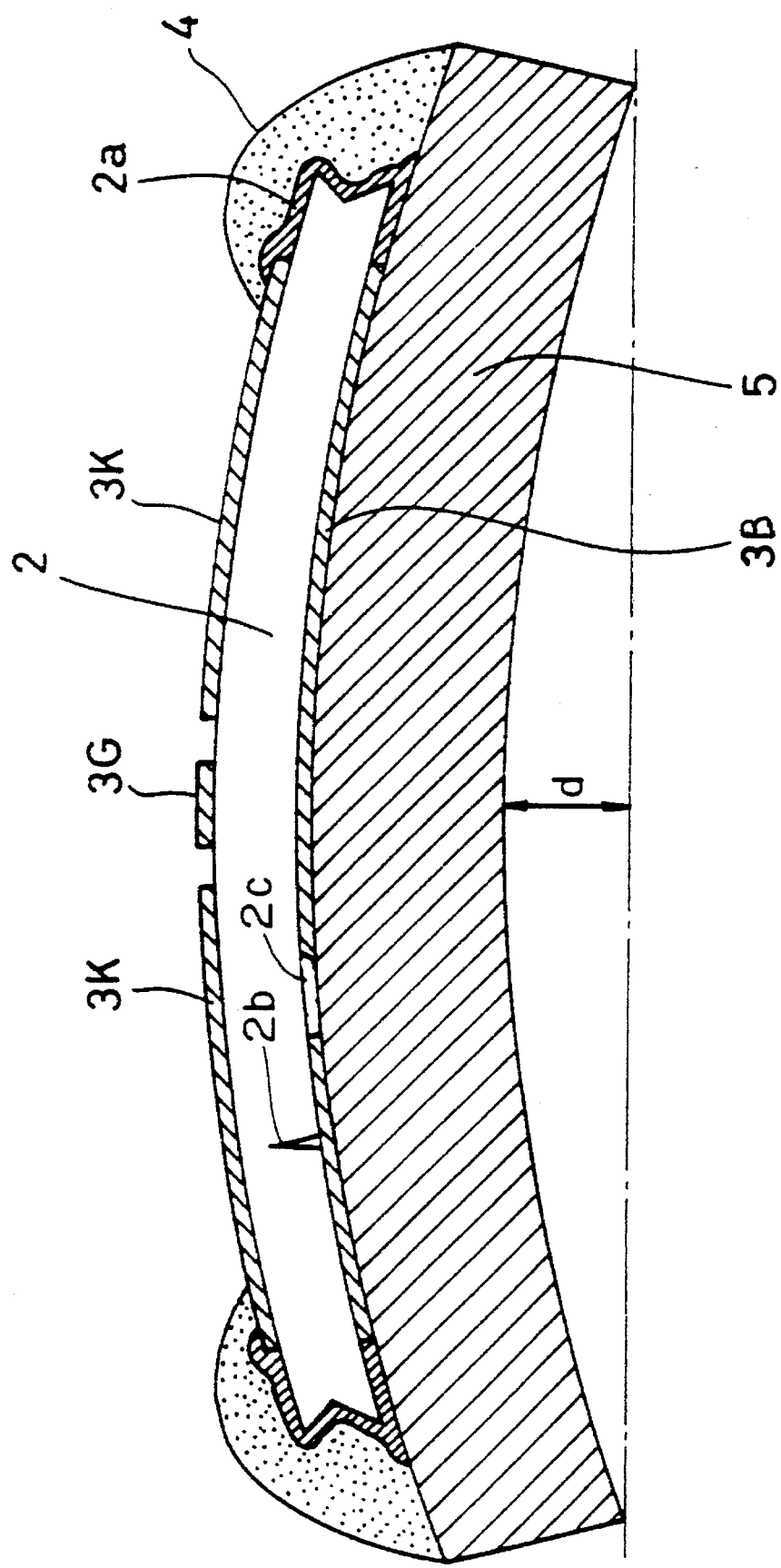

PRESSURE CONTACT TYPE SEMICONDUCTOR DEVICE AND HEAT COMPENSATOR

BACKGROUND OF THE INVENTION

1. Field of the Invention

The present invention relates to a press-pack type semiconductor device wherein electrical contact between main electrodes and a semiconductor substrate is effected by their pressure engagement and a method of fabricating the same, and a heat compensator to be used as a part of the press-pack type semiconductor device.

2. Description of the Background Art

Press-pack type semiconductor devices are constructed such that a semiconductor substrate is sandwiched between external electrodes. FIG. 15 is a vertical section of a power gate turn-off thyristor that is a typical prior art press-pack type semiconductor device. Referring to FIG. 15, the press-pack type semiconductor device 1 comprises a semiconductor substrate 2, first and second disc-like heat compensators 5 and 6 made of molybdenum, an anode copper block 10A, and a cathode copper block 10K. The semiconductor substrate 2 is sandwiched between the copper blocks 10A and 10K, with the heat compensators 5 and 6 fitted therebetween, respectively.

The semiconductor substrate 2 includes a disc-like silicon substrate having at least one pn junction. A brazing material layer 3B made of aluminum (Al) or AlSi is formed on the lower major surface of the semiconductor substrate 2. The semiconductor substrate 2 is brazed to the upper major surface of the heat compensator 5 with the brazing material layer 3B. A gate electrode layer 3G made of Al is formed centrally of the upper major surface of the semiconductor substrate 2, and a cathode electrode layer 3K made of Al is formed on the periphery of the upper major surface thereof. The lower major surface of the heat compensator 6 contacts the surface of the cathode electrode layer 3K under pressure.

Polyimide varnish 2a is applied to the outer peripheral edge of the semiconductor substrate 2 for insulating and protecting an exposed pn junction at the outer peripheral edge. Silicone rubber 4 is further applied to the outer peripheral edge of the semiconductor substrate 2 so as to cover the surface of the polyimide varnish 2a for the purpose of preventing electrical discharges along the edge.

The anode copper block 10A and cathode copper block 10K which are conductive include base portions 11A and 11K, and protruding portions 12A and 12K formed integrally with the base portions 11A and 11K, respectively. Metal flanges 13A and 13K are fixed on the outer periphery of the base portions 11A and 11K, respectively. A cylindrical casing 7 made of ceramic houses the heat compensators 5, 6, and the protruding portions 12A and 12K of the anode and cathode copper blocks 10A and 10K in such a manner as to hold the both surfaces of the semiconductor substrate 2 from vertically opposite sides in the interior of the casing 7. The flange 13A is fixedly brazed to the lower end surface of the casing 7, and the flange 13K is fixedly brazed to the upper end surface of the casing 7.

A through aperture 8 is formed centrally of the heat compensator 6, and a hole 9 is correspondingly formed in the cathode copper block 10K. The through aperture 8 and the hole 9 form a through hole into which a gate electrode support 14 is slidably fitted. A gate electrode 15 is connected to one end of an L-shaped conductor 16. The conductor 16 passes through the lower end portion of the gate electrode support 14 and then through the interior of an insulating tube 17, is drawn out of the casing 7, and is connected by welding to an external gate electrode 18 passing through the casing 7. The gate electrode support 14 is made of an insulating material. A spring 19 is abutted against the upper end of the gate electrode support 14 to urge the gate electrode support 14 downwardly. Consequently, the gate electrode 15 is pressed against the gate electrode layer 3G, to achieve the electrical connection therebetween.

For use in a predetermined equipment, the press-pack type semiconductor device 1 is inserted between anode and cathode members 20A and 20K of the predetermined equipment. External springs not shown urge the anode and cathode members 20A and 20K in the directions of the arrows, respectively, to bring the lower surface of the cathode member 20K into pressure contact with the upper surface of the cathode copper block 10K and to bring the upper surface of the anode member 20A into pressure contact with the lower surface of the anode copper block 10A. This secures the electrical connection between the cathode member 20K and the cathode electrode layer 3K through the cathode copper block 10K and heat compensator 6. The external gate electrode 18 is connected to a gate electrode connecting member (not shown) of the equipment.

In the foregoing state, when a voltage is applied between the anode member 20A and the cathode member 20K, a current flows in the semiconductor device 1 to develop heat from the semiconductor substrate 2. The heat is transferred through the heat compensators 5, 6 and through the anode and cathode copper blocks 10A, 10K to be radiated to the anode and cathode members 20A, 20K. The semiconductor device 1 that is a power semiconductor device carries a large amount of current and, accordingly, generates a large amount of heat. For this reason, when the semiconductor device 1 is used, with the copper blocks 10A and 10K pressed or brazed in direct contact with the semiconductor substrate 2, a thermal stress is generated between the copper blocks 10A, 10K and the semiconductor substrate 2 due to different thermal expansion coefficients therebetween, resulting in damages to the semiconductor substrate 2. The heat compensators 5, 6 having the thermal expansion coefficient relatively close to that of the semiconductor substrate 2 are provided for the purpose of absorbing thermal distortion causing damage to the semiconductor substrate 2.

In the conventional press-pack type semiconductor device 1, the semiconductor substrate 2 is fixed to the heat compensator 5 by brazing. The brazing is carried out at a high temperature of about 700° C. As a result, when the temperature is brought back to room temperature on completing the brazing, the difference in thermal expansion coefficient between the semiconductor substrate 2 and the heat compensator 5 causes warping deformation in the semiconductor substrate 2 and the heat compensator 5.

FIG. 16 schematically shows the deformation. The warping d measures about 100 μm where the thickness of the semiconductor substrate 2 is 1 mm, and the thickness and diameter of the heat compensator 5 are 4 mm and 85 mm, respectively. The warping deformation might cause inadequate electrical contact at the contact surfaces of the semiconductor substrate 2 and the heat compensator 6 and at the contact surfaces of the heat compensator 5 and the anode copper block 10A. The result is excessive heat generated due to the current, presenting the problem of electrical characteristic deterioration such as reduction in current-carrying capacity.

Other problems are that the brazing material such as Al or AlSi locally enters the interior of the semiconductor substrate 2 to produce a spike 2b and that a void 2c which is a cavity is produced in the brazing material layer 3B. The spike 2b decreases the breakdown voltage between the brazing material layer 3b and the cathode electrode layer 3K. The void 2c deteriorates electrical connection between the semiconductor substrate 2 and the heat compensator 5.

SUMMARY OF THE INVENTION

According to the present invention, a press-pack type semiconductor device comprises: (a) a semiconductor substrate including (a-1) a semiconductor substrate body having at least one junction of different conductivity type semiconductor layers, and first and second major surfaces, and (a-2) first and second conductive electrode layers of flat plate shape formed on the first and second major surfaces, respectively; (b) a first electrically conductive heat compensator having first and second major surfaces, the first major surface of the first heat compensator contacting an outer major surface of the first electrode layer; (c) a second electrically conductive heat compensator having first and second major surfaces, the first major surface of the second heat compensator contacting an outer major surface of the second electrode layer, the second heat compensator being shaped such that its outer peripheral edge protrudes outwardly from the outer peripheral edge of the semiconductor substrate, the second heat compensator including a recess formed in the first major surface thereof, the recess having a surface retracted from the first major surface of the second heat compensator, and the recess being formed along the outer peripheral edge of the semiconductor substrate and having a predetermined width including a projected portion of the outer peripheral edge of the semiconductor substrate; (d) a bonding retentive material applied to the recess, the outer peripheral edge of the semiconductor substrate and its adjacent portion for fixing the outer peripheral edge of the semiconductor substrate and its adjacent portion on the second heat compensator, the bonding retentive material including (d-1) a first portion for filling the recess, and (d-2) a second portion contacting the first portion, the second portion being other than the first portion; (e) first and second electrically conductive blocks each having at least one major surface, the major surfaces of the first and second conductive blocks contacting the second major surfaces of the first and second heat compensators, respectively; and (f) housing means having two opposed openings for housing the semiconductor substrate, the first and second heat compensators, and the first and second conductive blocks in such a manner that parts of the first and second conductive blocks are exposed at the two openings, respectively, the housing means having substantially electrically insulating properties, the thermal expansion coefficient of the first heat compensator being closer to that of the semiconductor substrate than that of the first conductive block, the thermal expansion coefficient of the second heat compensator being closer to that of the semiconductor substrate than that of the second conductive block.

In the press-pack type semiconductor device of the present invention, since the semiconductor substrate is brazed to neither of two heat compensators, the thermal distortion, spikes and voids resulting from brazing are not generated. The bonding retentive material fixes the outer peripheral edge of the semiconductor substrate and its adjacent portion on the second heat compensator, preventing position shifts of the semiconductor substrate without thermal distortion. The second heat compensator includes the recess into which the bonding retentive material enters to bond the major surface of the semiconductor substrate, so that the semiconductor substrate is reliably fixed on the second heat compensator with a substantial bond strength. The bonding retentive material includes two portions: a portion filling the recess and the other portion. The bonding retentive material which fills the recess before the semiconductor substrate is placed on the second heat compensator, contains few bubbles therein. Thus, the semiconductor substrate is more reliably fixed on the second heat compensator with a more substantial bond strength.

Preferably, the first and second conductive blocks are made substantially of copper.

The first and second conductive blocks of the press-pack type semiconductor device according to the present invention, which are made substantially of copper, have high electrical and thermal conductivity. Therefore, even if a large current flows therein, only a small amount of heat loss is generated and this heat is dissipated well to exterior devices. This facilitates providing the device adapted for a large current flow with ease.

Preferably, the second heat compensator further includes a first groove formed in the first major surface thereof inside of the inner periphery of the recess along the recess.

In the semiconductor device of the present invention, the second heat compensator includes the first groove inside of the inner periphery of the recess along the recess. The bonding retentive material penetrated between the semiconductor substrate and the second heat compensator stops at the groove to be prevented from entering the central portion. This secures the electrical contact between the semiconductor substrate and the second heat compensator.

Preferably, the second heat compensator further includes a plurality of apertures formed in the first groove and passing through to the second major surface thereof.

In the press-pack semiconductor device of the present invention, since the plurality of apertures are formed in the first groove of the second heat compensator which extend through to the second major surface, and since the semiconductor substrate is fixed on the second heat compensator with the bonding retentive material under reduced pressure, air and gases entered between the semiconductor substrate and the second heat compensator are discharged through the apertures. This ensures the electrical contact between the semiconductor substrate and the second heat compensator.

Preferably, the press-pack type semiconductor device further comprises: (g) an elastic ring disposed in the first groove in contact with the first groove and the outer major surface of the second electrode layer.

The press-pack type semiconductor device of the present invention comprises the elastic ring provided in the first groove of the second heat compensator for obstructing the bonding retentive material penetrated between the semiconductor substrate and the second heat compensator to securely prevent the bonding retentive material from penetrating into the central region. This ensures the electrical contact between the semiconductor substrate and the second heal compensator.

Preferably, the second heat compensator further includes a second groove formed in the bottom of the recess along the projected portion.

In the press-pack type semiconductor device of the present invention, the second heat compensator includes the second groove formed in the bottom of the recess along the outer peripheral contour of the semiconductor substrate. This ensures and facilitates the positioning of the semiconductor substrate when fixed on the second heat compensator.

Preferably, the second heat compensator further includes an aperture formed in the first major surface thereof inside of the inner periphery of the recess and passing through to the second major surface thereof.

The press-pack type semiconductor device of the present invention comprises the aperture formed in the first major surface inside of the inner periphery of the recess of the second heat compensator which extends through to the second major surface. The semiconductor substrate is fixed on the second heat compensator with the bonding retentive material under reduced pressure. Thus air and gases entered between the semiconductor substrate and the second heat compensator are discharged through the aperture. This ensures the electrical contact between the semiconductor substrate and the second heat compensator.

Preferably, the second heat compensator comprises: (c-1) a thin film layer for covering the surface, the thin film layer being made of an electrically conductive rectal softer than the inner portion of the second heat compensator covered thereby.

In the press-pack type semiconductor device of the present invention, the second heat compensator includes the thin film layer made of a metal softer than the inside thereof for covering the surface of the second heat compensator. This affords successful electrical contact between the semiconductor substrate and the second heat compensator.

In another aspect of the present invention, the press-pack type semiconductor device comprises: (a) a semiconductor substrate including (a-1) a semiconductor substrate body having at least one junction of different conductivity type semiconductor layers, and first and second major surfaces, and (a-2) first and second conductive electrode layers of flat plate shape formed on the first and second major surfaces, respectively; (b) a first electrically conductive heat compensator having first and second major surfaces, the first major surface of the first heat compensator contacting an outer major surface of the first electrode layer; (c) a second electrically conductive heat compensator having first and second major surfaces, the first major surface of the second heat compensator contacting an outer major surface of the second electrode layer, the second heat compensator being shaped such that its outer peripheral edge protrudes outwardly from the outer peripheral edge of the semiconductor substrate, the second heat compensator including a recess formed in the first major surface thereof, the recess having a surface retracted from the first major surface of the second heat compensator, and the recess being formed along the outer peripheral edge of the semiconductor substrate and having a predetermined width including a projected portion of the outer peripheral edge of the semiconductor substrate; (d) a bonding retentive material applied to the recess, the outer peripheral edge of the semiconductor substrate, its adjacent portion, and the outer periphery of the first heat compensator for fixing together the outer peripheral edge of the semiconductor substrate and its adjacent portion, the first heat compensator, and the second heat compensator, and the bonding retentive material (d) includes (d-1) a first portion for filling the recess, and (d-2) a second portion contacting the first portion, the second portion being other than the first portion; (e) first and second electrically conductive blocks, made substantially of copper, each having at least one major surface, the major surfaces of the first and second conductive blocks contacting the second major surfaces of the first and second heat compensators, respectively; and (f) housing means having two opposed openings for housing the semiconductor substrate, the first and second heat compensators, and the first and second conductive blocks in such a manner that parts of the first and second conductive blocks are exposed at the two openings, respectively, the housing means having substantially electrically insulating properties, the thermal expansion coefficient of the first heat compensator being closer to that of the semiconductor substrate than that of the first conductive block, the thermal expansion coefficient of the second heat compensator being closer to that of the semiconductor substrate than that of the second conductive block.

In the press-pack type semiconductor device of the present invention, the bonding retentive material fixes the semiconductor substrate and the first heat compensator on the second heat compensator, preventing the position shifts of the first heat compensator and the semiconductor substrate.

The present invention is also directed to a heat compensator for use in the press-pack type semiconductor device of the present invention as the second heat compensator. According to the present invention, the heat compensator comprises: (a) an electrically conductive heat compensator body having first and second major surfaces and having a thermal expansion coefficient closer to that of semiconductor than copper does, the heat compensator body including: an annular recess formed in the first major surface thereof with a first predetermined width having a bottom retracted from the first major surface thereof; a first groove formed in the first major surface inside of the inner periphery of the recess along the recess; a plurality of first apertures formed in the first groove and extending through to the second major surface thereof; a second annular groove formed in the bottom of the recess and spaced a predetermined distance apart from the outer periphery of the recess; and a second aperture formed in the first major surface inside of the inner periphery of the recess and extending through to the second major surface thereof; and (b) a thin film layer for covering the surface of the heat compensator body, the thin film layer being made of a metal softer than the heat compensator body.

The heat compensator according to the present invention forms the press-pack type semiconductor device of the present invention.

The present invention is also directed to a method of fabricating a press-pack type semiconductor device. According to the present invention, the method comprises the steps of: (a) providing a semiconductor substrate including (a-1) a semiconductor substrate body having at least one junction of different conductivity type semiconductor layers, and first and second major surfaces, and (a-2) first and second conductive electrode layers of flat plate shape formed on the first and second major surfaces, respectively; (b) providing housing means having two opposed openings and having substantially electrically insulating properties; (c) providing first and second conductive blocks each having at least one major surface and made substantially of copper; (d) providing a first conductive heat compensator having first and second major surfaces, the thermal expansion coefficient of the first heat compensator being closer to that of the semiconductor substrate than that of copper; (e) providing a second conductive heat compensator having first and second major surfaces, the thermal expansion coefficient of the second heat compensator being closer to that of the semiconductor substrate than that of copper, the second heat compensator being shaped such that its outer peripheral edge protrudes outwardly from the outer peripheral edge of the semiconductor substrate when the semiconductor substrate is placed in a predetermined position on the first major surface thereof, the second heat compensator including a recess formed in the first major surface thereof, the recess having a surface retracted from the first major surface of the second heat compensator, and the recess having a predetermined width including a projected portion of the outer peripheral edge of the semiconductor substrate and being formed along the outer peripheral edge of the semiconductor substrate when the semiconductor substrate is placed in the predetermined position on the first major surface of the second heat compensator; (f) applying a first bonding retentive material to the recess to harden the first bonding retentive material; (g) placing the semiconductor substrate in the predetermined position on the first major surface of the second heat compensator in such a manner that the first major surface of the second heat compensator contacts the outer major surface of the second electrode layer; (h) applying a second bonding retentive material to the first bonding retentive material hardened in the step (f) and to the outer peripheral edge of the semiconductor substrate and its adjacent portion and hardening the second bonding retentive material under reduced pressure to fix the outer peripheral edge of the semiconductor substrate and its adjacent portion on the second heat compensator; and (i) housing the first heat compensator, the second heat compensator on which the semiconductor substrate is fixed, and the first and second conductive blocks in the housing means so as to expose parts of the first and second conductive blocks at the two openings, respectively, with the first major surface of the first heat compensator in contact with the outer major surface of the first electrode layer and with the major surfaces of the first and second conductive blocks in contact with the second major surfaces of the first and second heat compensators, respectively.

In another aspect of the present invention, the method comprises the steps of: (a) providing a semiconductor substrate including (a-1) a semiconductor substrate body having at least one junction of different conductivity type semiconductor layers, and first and second major surfaces, and (a-2) first and second conductive electrode layers of flat plate shape formed on the first and second major surfaces, respectively; (b) providing housing means having two opposed openings and having substantially electrically insulating properties; (c) providing first and second conductive blocks each having at least one major surface and made substantially of copper; (d) providing a first conductive heat compensator having first and second major surfaces, the thermal expansion coefficient of the first heat compensator being closer to that of the semiconductor substrate than that of copper; (e) providing a second conductive heat compensator having first and second major surfaces, the thermal expansion coefficient of the second heat compensator being closer to that of the semiconductor substrate than that of copper, the second heat compensator being shaped such that its outer peripheral edge protrudes outwardly from the outer peripheral edge of the semiconductor substrate when the semiconductor substrate is placed in a predetermined position on the first major surface thereof, the second heat compensator including a recess formed in the first major surface thereof, the recess having a surface retracted from the first major surface of the second heat compensator, and the recess having a predetermined width including a projected portion of the outer peripheral edge of the semiconductor substrate and being formed along the outer peripheral edge of the semiconductor substrate when the semiconductor substrate is placed in the predetermined position on the first major surface of the second heat compensator; (f) applying a first bonding retentive material to the recess to harden the first bonding retentive material; (g) placing the semiconductor substrate in the predetermined position on the first major surface of the second heat compensator in such a manner that the first major surface of the second heat compensator contacts the outer major surface of the second electrode layer; (h) placing the first heat compensator on the semiconductor substrate in such a manner that the first major surface of the first heat compensator contacts the outer major surface of the first electrode layer; (i) applying a second bonding retentive material to the first bonding retentive material hardened in the step (f), the outer peripheral edge of the semiconductor substrate, its adjacent portion, and the outer periphery of the first heat compensator and hardening the second bonding retentive material under reduced pressure to fix together the outer peripheral edge of the semiconductor substrate and its adjacent portion, the first heat compensator, and the second heat compensator; and (j) housing the first heat compensator, the second heat compensator on which the semiconductor substrate is fixed, and the first and second conductive blocks in the housing means so as to expose parts of the first and second conductive blocks at the two openings, respectively, with the major surfaces of the first and second conductive blocks in contact with the second major surfaces of the first and second heat compensators, respectively.

The press-pack type semiconductor device having the foregoing characteristics is fabricated by the methods of the present invention.

In still another aspect of the present invention, the method comprises the steps of: (a) providing a semiconductor substrate including (a-1) a semiconductor substrate body having at least one junction of different conductivity type semiconductor layers, and first and second major surfaces, and (a-2) first and second conductive electrode layers of flat plate shape formed on the first and second major surfaces, respectively; (b) providing housing means having two opposed openings and having substantially electrically insulating properties; (c) providing first and second conductive blocks each having at least one major surface and made substantially of copper; (d) providing a first conductive heat compensator having first and second major surfaces, the thermal expansion coefficient of the first heat compensator being closer to that of the semiconductor substrate than that of copper; (c) providing a second conductive heat compensator having first and second major surfaces, the thermal expansion coefficient of the second heat compensator being closer to that of the semiconductor substrate than that of copper, the second heat compensator being shaped such that its outer peripheral edge protrudes outwardly from the outer peripheral edge of the semiconductor substrate when the semiconductor substrate is placed in a predetermined position on the first major surface thereof, the second heat compensator including a recess formed in the first major surface thereof, the recess having a surface retracted from the first major surface of the second heat compensator, and the recess having a predetermined width including a projected portion of the outer peripheral edge of the semiconductor substrate and being formed along the outer peripheral edge of the semiconductor substrate when the semiconductor substrate is placed in the predetermined position on the first major surface of the second heat compensator; (f) providing an annular bonding retentive material which is a hardened bonding retentive material of a predetermined configuration, the annular bonding retentive material being permitted to fill the recess whereby substantially no spacing is formed between the surface of the annular bonding retentive material and a surface of the recess; (g) filling the recess with the annular bonding retentive material provided in the step (f);

(h) placing the semiconductor substrate in the predetermined position on the first major surface of the second heat compensator in such a manner that the first major surface of the second heat compensator contacts the outer major surface of the second electrode layer; (i) applying a bonding retentive material to the outer peripheral edge of the semiconductor substrate and its adjacent portion and hardening the bonding retentive material under reduced pressure to fix the outer peripheral edge of the semiconductor substrate and its adjacent portion on the second heat compensator; and (j) housing the first heat compensator, the second heat compensator on which the semiconductor substrate is fixed, and the first and second conductive blocks in the housing means so as to expose parts of the first and second conductive blocks at the two openings, respectively, with the first major surface of the first heat compensator in contact with the outer major surface of the first electrode layer and with the major surfaces of the first and second conductive blocks in contact with the second major surfaces of the first and second heat compensators, respectively.

In the method of the present invention, the bonding retentive material which is the previously hardened and formed is applied to the recess of the second heat compensator, facilitating the step of applying the bonding retentive material to the recess.

An object of the present invention is to provide a press-pack type semiconductor device which is prevented from electrical characteristic deterioration resulting from brazing of a semiconductor substrate to a heat compensator, a method of fabricating the same, and the heat compensator.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4, 5, 6A to 6C, 7A, and 7B show the steps of fabricating the semiconductor device of the first preferred embodiment;

FIG. 8 is a front sectional view of a major part of the semiconductor device according to a second preferred embodiment of the present invention;

DESCRIPTION OF THE PREFERRED EMBODIMENTS

FIRST PREFERRED EMBODIMENT

Structure of Semiconductor Device 100

Figure 1:
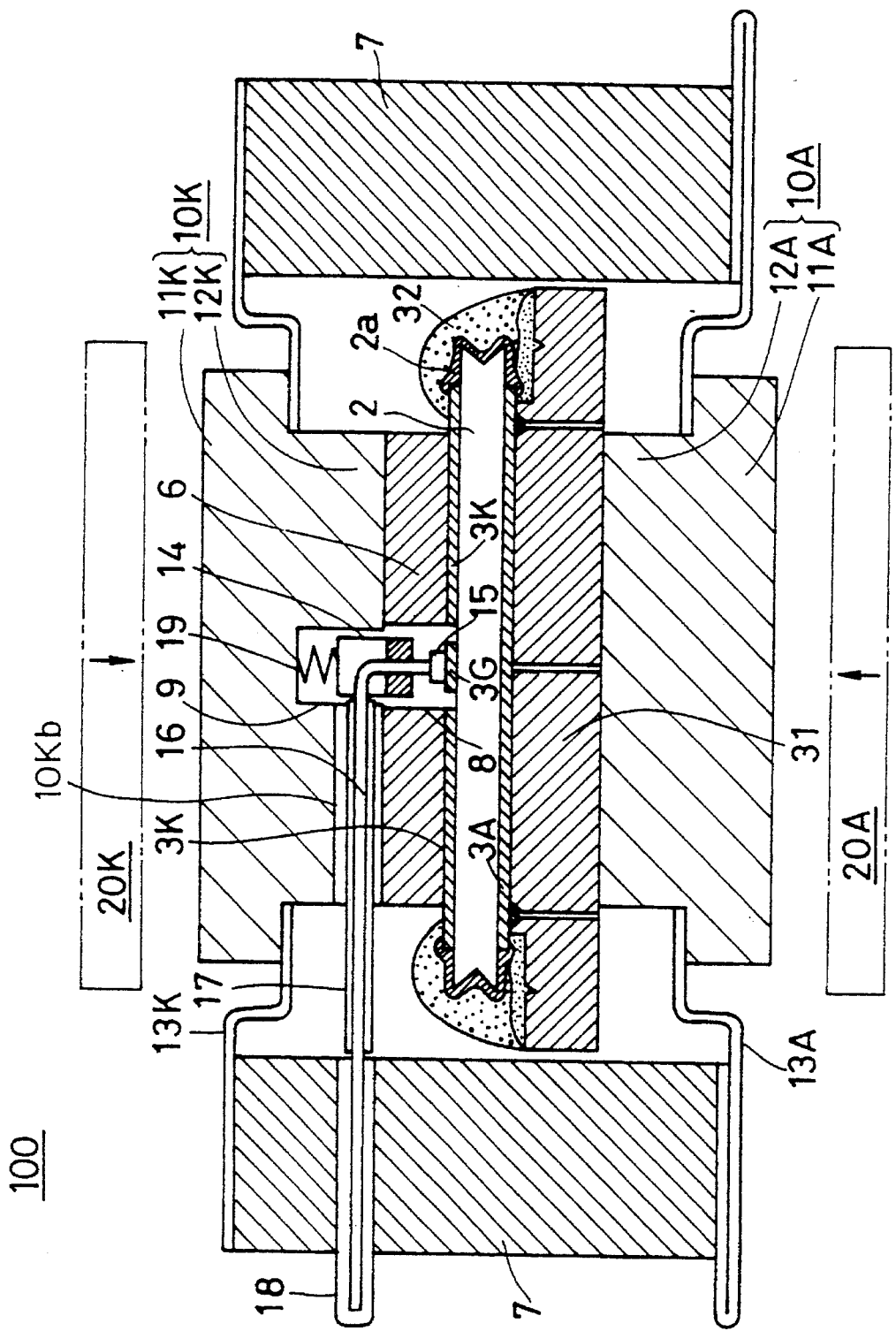
FIG. 1 is a front sectional view of a press-pack type semiconductor device according to a first preferred embodiment of the present invention.
Figure 2:
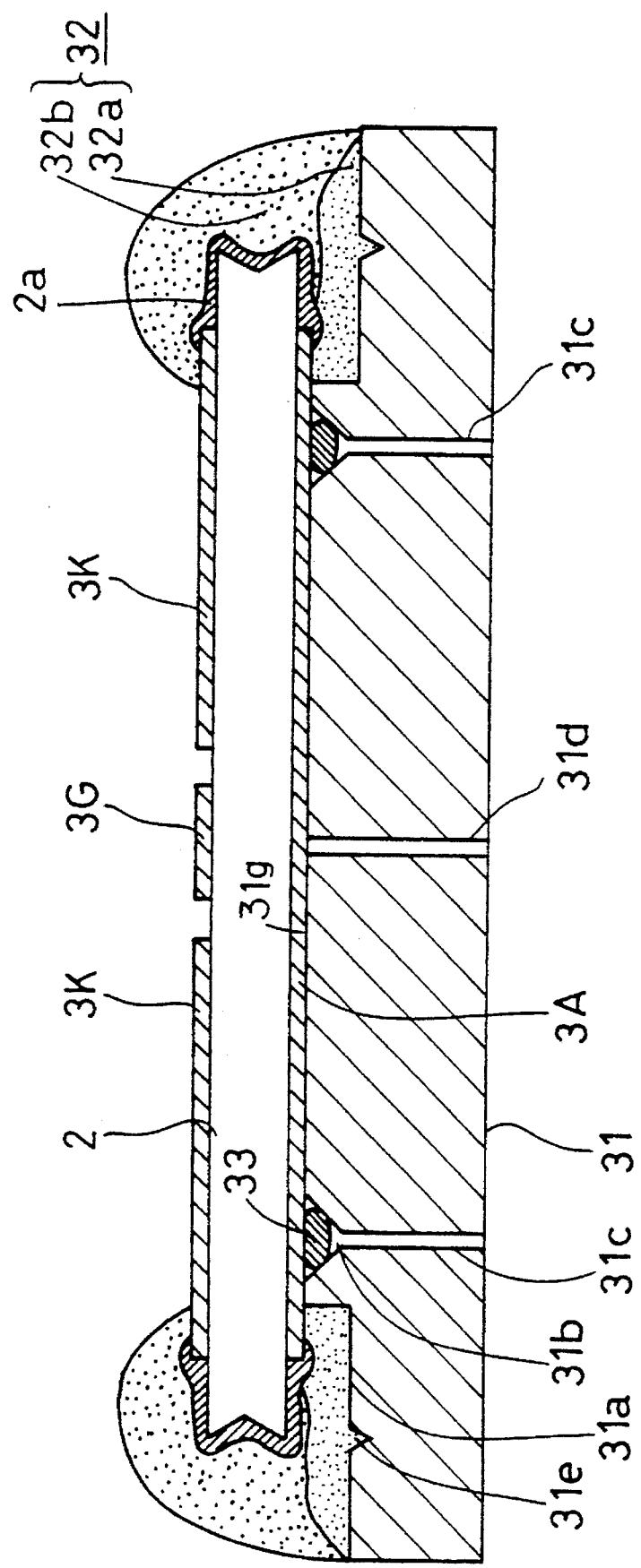
FIG. 2 is a partial detail view, with portions enlarged, of FIG. 1.
Figure 3:
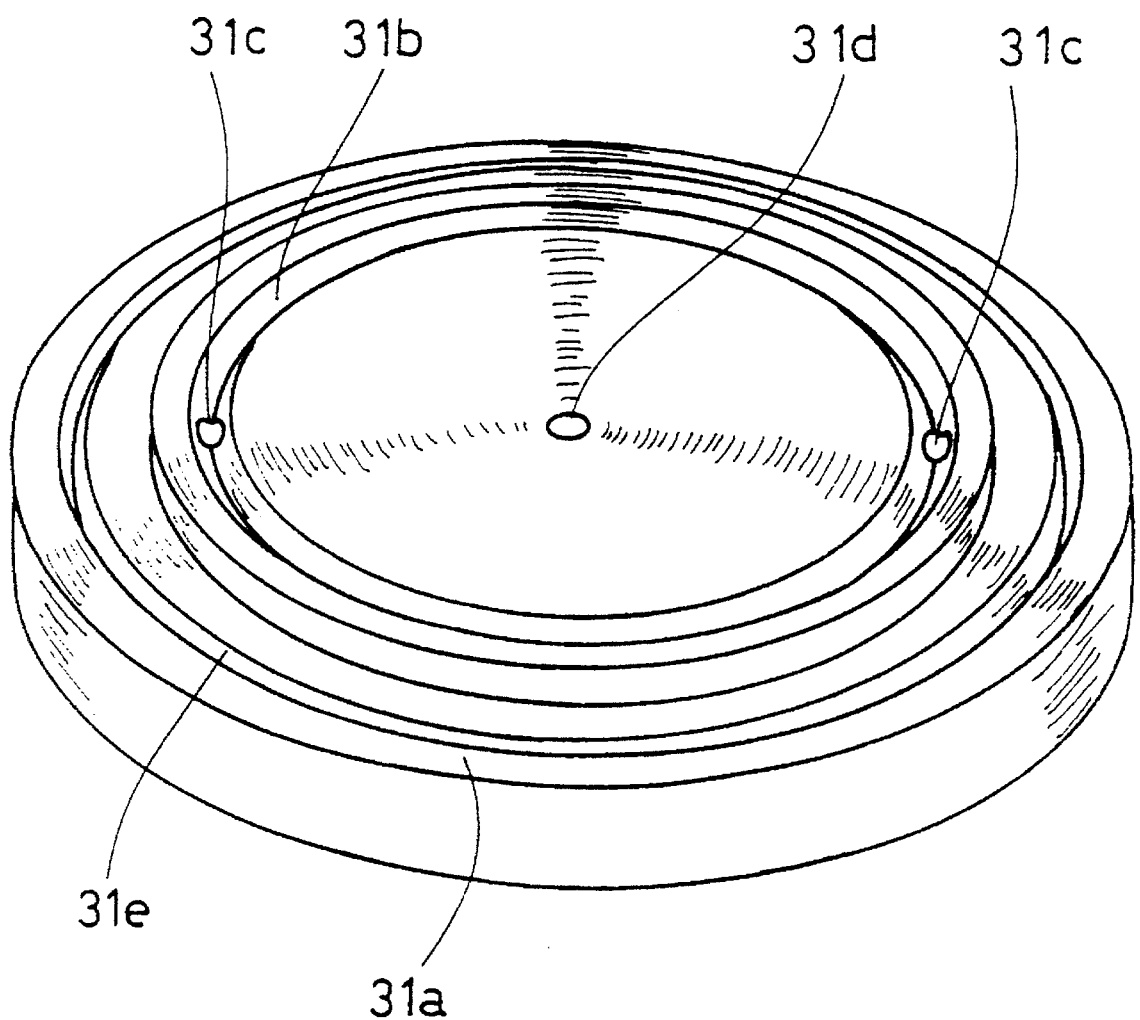
FIG. 3 is a perspective view of a heat compensator according to the first preferred embodiment.

FIG. 1 is a front sectional view of a press-pack type semiconductor device 100 according to a first preferred embodiment of the present invention. The semiconductor device 100 is a power gate turn-off thyristor. FIG. 2 is a partial detail view, with portions enlarged, of FIG. 1. FIG. 3 is a perspective view of a heat compensator 31 which is a part of the press-pack type semiconductor device 100. Referring to FIGS. 1 to 3, description will be given on the structure of the semiconductor device 100 hereinafter.

A semiconductor substrate 2 includes a disc-like silicon substrate having at least one pn junction. An anode electrode layer 3A is formed over the lower major surface of the semiconductor substrate 2 except adjacent the outer peripheral edge of the semiconductor substrate 2. A gate electrode layer 3G is formed centrally of the upper major surface of the semiconductor substrate 2, and a cathode electrode layer 3K is formed on the periphery thereof. These electrode layers are formed by Al deposition.

The semiconductor substrate 2 and the heat compensators 31, 6 which are of disc-like configuration are positioned concentrically. The lower surface of the heat compensator 6 is in contact with the surface of the cathode electrode layer 3K under pressure. Likewise, the upper surface of the heat compensator 31 is in contact with the surface of the anode electrode layer 3A under pressure. The semiconductor device 100 differs from the conventional semiconductor device 1 of FIG. 15 in that the semiconductor substrate 2 is not brazed to the heat compensator 31. The disc-like heat compensators 31 and 6 including a main portion made of molybdenum and an epidermal portion have a thermal expansion coefficient closer to that of the semiconductor substrate 2 than anode and cathode copper blocks 10A and 10K do and are provided for the purpose of absorbing thermal distortion to prevent damage to the semiconductor substrate 2 due to the thermal distortion as heat is generated.

The diameter of the heat compensator 31 is larger than that of the semiconductor substrate 2 and is slightly smaller than the inner diameter of a cylindrical casing 7 made of ceramic. A recess 31a is formed in the upper major surface of the heat compensator 31 in concentric relation with the outer periphery of the heat compensator 31. The recess 31a is formed so that, when the semiconductor substrate 2 is disposed in position on the upper major surface of the heat compensator 31, there is a spacing between the semiconductor substrate 2 adjacent its outer peripheral edge and the heat compensator 31. The size of the spacing or the depth of the recess 31a is, for example, 0.2 to 0.3 mm.

A V-shaped groove 31e having the same diameter as the semiconductor substrate 2 is formed in the recess 31a in concentric relation with the outer periphery of the heat compensator 31. The V-shaped groove 31c is used as a mark for positioning when the semiconductor substrate 2 is placed in position on the upper major surface of the heat compensator 31 in the assembly step of the semiconductor device 100 to be described later.

The semiconductor substrate 2 includes polyimide varnish 2a at its outer peripheral edge. The polyimide varnish 2a applied is an insulating material for insulating and protecting an exposed pn junction at the outer peripheral edge. Around the outer peripheral edge of the semiconductor substrate 2 is formed a bonding protective material excellent in electrical insulating properties, bond properties and heat-resistance, for example silicone rubber 32, so as to cover the polyimide varnish 2a. The silicone rubber 32 is provided for the purposes of preventing electrical discharge along the outer peripheral edge of the semiconductor substrate 2 and fixing the semiconductor substrate 2 on the heat compensator 31. Thus the silicone rubber 32 has a predetermined thickness or more which covers the outer peripheral edge of the semiconductor substrate 2 and is formed over the recess 31a of the heat compensator 31. In particular, the silicone rubber 32 enters between the recess 31a and the opposing lower surface of the semiconductor substrate 2 including the anode electrode layer 3A and the polyimide varnish 2a to bond them together. This prevents the above-mentioned electrical discharge, and permits the outer peripheral edge of the semiconductor substrate 2 and its adjacent portion to be bonded to the recess 31a, so that the semiconductor substrate 2 is fixed on the heat compensator 31.

The heat compensator 31 includes another V-shaped groove 31b formed in the upper major surface thereof in a position somewhat inward from the inner peripheral edge of the recess 31a in concentric relation with the outer periphery of the heat compensator 31. A plurality of through apertures 31c perpendicular to the major surface of the heat compensator 31 are formed in the V-shaped groove 31b. Preferably, the through apertures 31c are disposed in one or plural pairs in diametrically symmetrical positions. One pair of through apertures 31c are shown in FIG. 3. The inner diameter of the through apertures 31c is smaller than the width of the V-shaped groove 31b, for example 0.8 to 1.5 mm. Another through aperture 31d perpendicular to the major surface of the heat compensator 31 is formed centrally of the heat compensator 31. The diameter of the through aperture 31d is equal to the diameter of the through apertures 31c, for example 0.8 to 1.5 mm. Preferably, the diameter of the V-shaped groove 31b is greater than that of the heat compensator 6, since this allows reduction in bending moment generated in the semiconductor substrate 2 when the opposite major surfaces of the semiconductor substrate 2 are pressed by the heat compensators 6 and 31, thereby avoiding the danger of damages to the semiconductor substrate 2.

The surface of the main portion of the heat compensator 31 made of molybdenum is covered throughout with a thin film layer 31g formed of Al, silver, nickel or gold by metal deposition or plating. The thin film layer 31g advantageously holds the electrical and thermal contact between the heat compensator 31 and the anode electrode layer 3A and between the heat compensator 31 and the anode copper block 10A. The heat compensator 6 includes a like thin film layer.

The silicone rubber 32 is formed in two steps to be described below. That is, silicone rubber 32a that is a first portion of the silicone rubber 32 is formed before the semiconductor substrate 2 is placed on the heat compensator 31, and then silicone rubber 32b that is a second portion of the silicone rubber 32 is formed, with the semiconductor substrate 2 placed on the heat compensator 31. An O-ring 33 is disposed in the V-shaped groove 31b. The O-ring 33 is made of silicone rubber, for example. The V-shaped groove 31b and O-ring 33 are formed in the step of applying the second silicone rubber 32b for the purpose of preventing the second silicone rubber 32b from entering between the semiconductor substrate 2 and the heat compensator 31, which will be described later.

The anode and cathode copper blocks 10A and 10K which are conductive include base portions 11A and 11K, and protruding portions 12A and 12K formed integrally with the base portions 11A and 11K, respectively. Metal flanges 13A and 13K are fixed on the outer periphery of the base portions 11A and 11K, respectively. The cylindrical casing 7 made of ceramic houses the heat compensators 6, 31, and the protruding portions 12A, 12K of the anode and cathode copper blocks 10A, 10K in such a manner as to hold the opposite major surfaces of the semiconductor substrate 2 from vertically opposite sides in the interior of the casing 7. The flange 13A is fixedly brazed to the lower end surface of the casing 7, and the flange 13K is fixedly brazed to the upper end surface of the casing 7. That is, the press-pack type semiconductor device 100 is constructed such that the semiconductor substrate 2 is held between the cathode and anode copper blocks 10K and 10A under pressure, with the heat compensators 6 and 31 sandwiched therebetween, respectively. The interior space defined by the casing 7 and the flanges 13A, 13K is filled with an inert gas such as gaseous nitrogen. The inert gas prevents the oxidation or deterioration of the semiconductor substrate 2 and heat compensators 6, 31 housed in the space.

A through aperture 8 is formed centrally of the heat compensator 6, and a hole 9 is formed correspondingly in the cathode copper block 10K. The through aperture 8 and the hole 9 form a through hole into which a gate electrode support 14 is slidably fitted. A gate electrode 15 is connected to one end of an L-shaped conductor 16. The conductor 16 passes through the lower end portion of the gate electrode support 14 and then through the interior of an insulating tube 17, is drawn out of the casing 7, and is connected by welding to an external gate electrode 18 passing through the casing 7. The gate electrode support 14 is made of an insulating member, and a spring 19 is abutted against the top end of the gate electrode support 14 to urge the gate electrode support 14 downwardly. As a result, the gate electrode 15 is pressed against the gate electrode layer 3G, achieving the electrical connection therebetween. A groove 10Kb for housing the conductor 16 covered with the insulating tube 17 is formed radially in the lower end surface of the cathode copper block 10K.

For use in a predetermined equipment, the press-pack type semiconductor device 100 is inserted between anode and cathode members 20A and 20K of the predetermined equipment. The anode and cathode members 20A and 20K are urged in the directions of the arrows of FIG. 1 by external springs not shown, respectively, so that the lower surface of the cathode member 20K is brought into pressure contact with the upper surface of the cathode copper block 10K and the upper surface of the anode member 20A is brought into pressure contact with the lower surface of the anode copper block 10A. This secures the electrical connection between the cathode member 20K and the cathode electrode layer 3K through the cathode copper block 10K and heat compensator 6 and the electrical connection between the anode member 20A and the anode electrode layer 3A through the anode copper block 10A and heat compensator 31. The external gate electrode 18 is connected to a gate electrode connecting member (not shown) of the equipment.

In the semiconductor device 100, the semiconductor substrate 2 is not brazed to the heat compensators 6, 31 but is held in electrical contact therewith by pressure engagement. Thus the thermal distortion, spike 2b, and void 2c which result from the brazing are not generated. Since the outer peripheral edge of the semiconductor substrate 2 and its adjacent portion are fixed on the heat compensator 31 by the silicone rubber 32, the position shift of the semiconductor substrate 2 is prevented without the thermal distortion. Further, since the silicone rubber 32 enters the recess 31a of the heat compensator 31 to bond the lower surface of the semiconductor substrate 2 to the heat compensator 31, the semiconductor substrate 2 is fixed to the heat compensator 31 securely with a substantial bond strength.

When the semiconductor device 100 is neither in use nor is connected to the anode and cathode members 20A and 20K of the predetermined equipment, the heat compensator 31 on which the semiconductor substrate 2 is fixed is held at a lower pressure, the position of the heat compensator 31 being liable to be displaced in the casing 7. However, since the outer diameter of the heat compensator 31 is slightly smaller than the inner diameter of the casing 7, the position shift is reduced to such a degree that there is no problem in practice.

Fabrication Steps of Semiconductor Device 100

Figure 4:
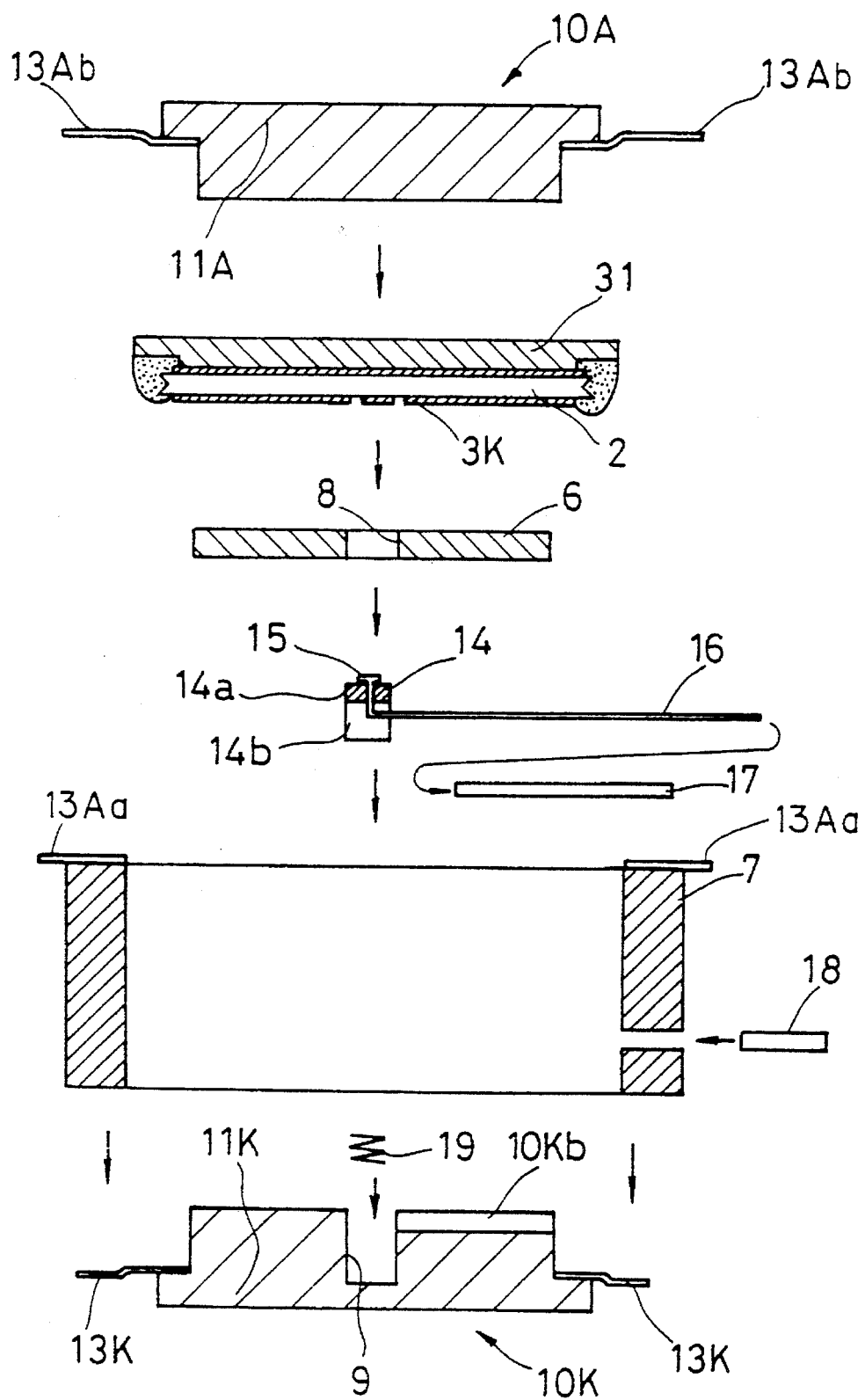

FIGS. 4, 5, 6A to 6C, 7A, and 7B show the steps of fabricating the semiconductor device 100. Referring now to FIG. 4, the procedure of assembling the semiconductor device 100 will be discussed hereinafter.

(1) A component is initially provided which includes the cylindrical casing 7 made of ceramic, the tubular external gate electrode 18 having open opposite ends and passing through the casing 7 in a predetermined position, a flange 13Aa serving as a part of the metal flange 13A and bonded to the upper end surface of the casing 7, the metal flange 13K bonded at its outer upper end surface to the lower end surface of the casing 7, and the cathode copper block 10K having the base portion 11K whose periphery is bonded to the inner lower end surface of the flange 13K. In the component, the relative position of the cathode copper block 10K and the casing 7 is designed so that the external gate electrode 18 faces the groove 10Kb formed in the upper end surface of the cathode copper block 10K. The inner diameter of the external gate electrode 18 is somewhat larger than the diameter of the conductor 16. Bonding is made by silver brazing between the casing 7 and flange 13Aa, between the casing 7 and the flange 13K, between the casing 7 and external gate electrode 18, and between the cathode copper block 10K and flange 13K.

(2) The spring 19 is inserted into the hole 9 formed centrally of the cathode copper block 10K of the component.

(3) The gate electrode support 14 fitted at its head with the gate electrode 15 is inserted into the hole 9 of the cathode copper block 10K. At that time, the conductor 16 connected to the gate electrode 15 is fitted in the insulting tube 17 and then in the external gate electrode 18. The mounting of the gate electrode 15 is made in such a manner that a first end of the conductor 16 connected at its second end to the gate electrode 15 is inserted into an aperture 14a passing-through the gate electrode support 14 in the axial direction and is then drawn out of a notch 14b formed in the lower portion of the gate electrode support 14, as shown in FIG. 5.

(4) Referring again to FIG. 4, the heat compensator 6 is placed on the cathode copper block 10K so that the through aperture 8 formed centrally of the heat compensator 6 receives the head of the gate electrode support 14.

(5) The semiconductor substrate 2 whose outer peripheral portion is bonded to the heat compensator 31 is inserted into the casing 7, with the face of the cathode electrode layer 3K positioned downside, and is then placed on the heat compensator 6.

The semiconductor substrate 2 is previously fixed on the heat compensator 31 as above described. The fixing process will be discussed below with reference to FIGS. 6A to 6C, 7A and 7B.

The heat compensator 31 is initially placed on a horizontal table (not shown) with the recess 31a side located to face upward. The heat compensator 31 includes the recess 31a, the V-shaped groove 31b, the through apertures 31c, the through aperture 31d, and the V-shaped groove 31e. The heat compensator 31 further includes the thin film layer 31g thereover.

The first silicone rubber 32a is applied to the recess 31a (FIG. 6A) by means of a bonding retentive member supply unit including a nozzle 42 to be described later in the same manner as the second silicone rubber 32b to be described below. Preferably, the thickness of the silicone rubber 32a finally hardened is slightly smaller than the depth of the recess 31a, that is, the thickness is determined such that the upper surface of the hardened silicone rubber 32a is slightly lower than the upper major surface of the heat compensator 31. On completion of the application of the silicone rubber 32a, the heat compensator 31 is inserted into a vacuum vessel (not shown) and is then heated under vacuum or in inert gas to harden the silicone rubber 32a. The heating and hardening under vacuum or in inert gas is performed to effectively remove bubbles generated from the silicone rubber 32a during the heating and hardening process. The hardened silicone rubber 32a is bonded to the recess 31a.

Figure 6A:
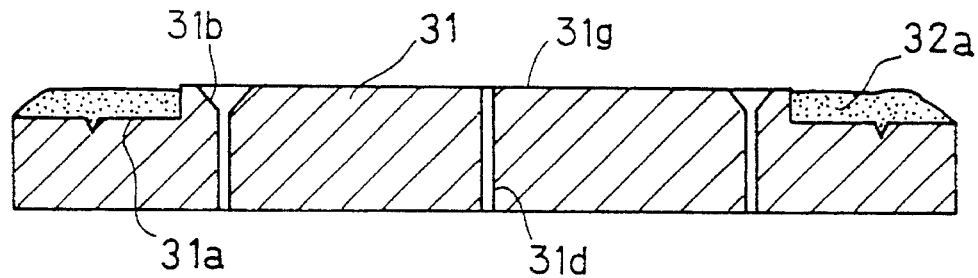
Figure 6B:
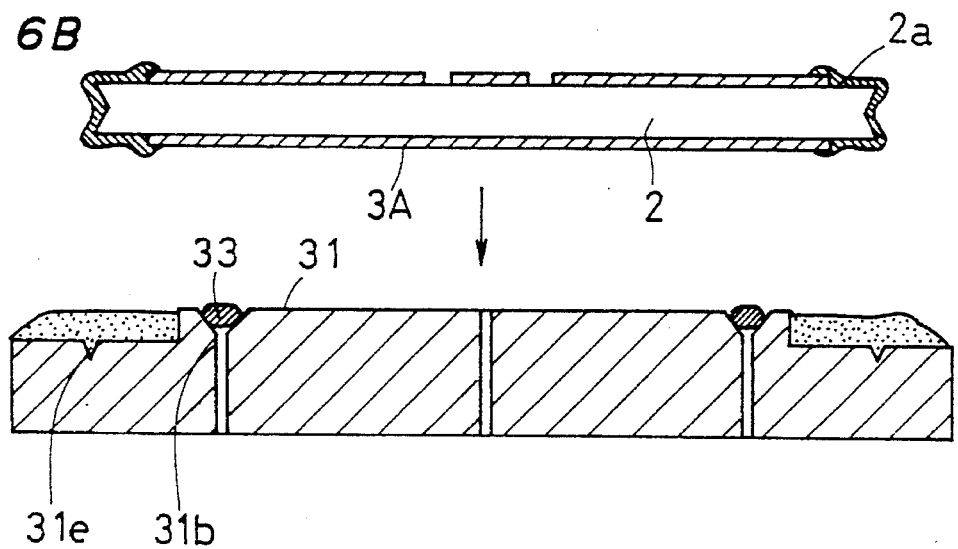

On completion of hardening, the O-ring 33 is inserted in the V-shaped groove 31b, and the semiconductor substrate 2 is placed on the heat compensator 31 centrally thereof with the face of the anode electrode layer 3A of the semiconductor substrate 2 positioned downside (FIG. 6B). While the V-shaped groove 31e is visually confirmed through the silicone rubber 32a, the semiconductor substrate 2 is placed so that the outer peripheral edge of the semiconductor substrate 2 is located just above the V-shaped groove 31e. The V-shaped groove 31e is provided for the purpose of facilitating and securing the positioning of the semiconductor substrate 2 when placed on the heat compensator 31. The silicone rubber 32a is selectively used which is to some degree pervious to light with the thickness corresponding to the depth of the recess 31a.

Figure 6C:
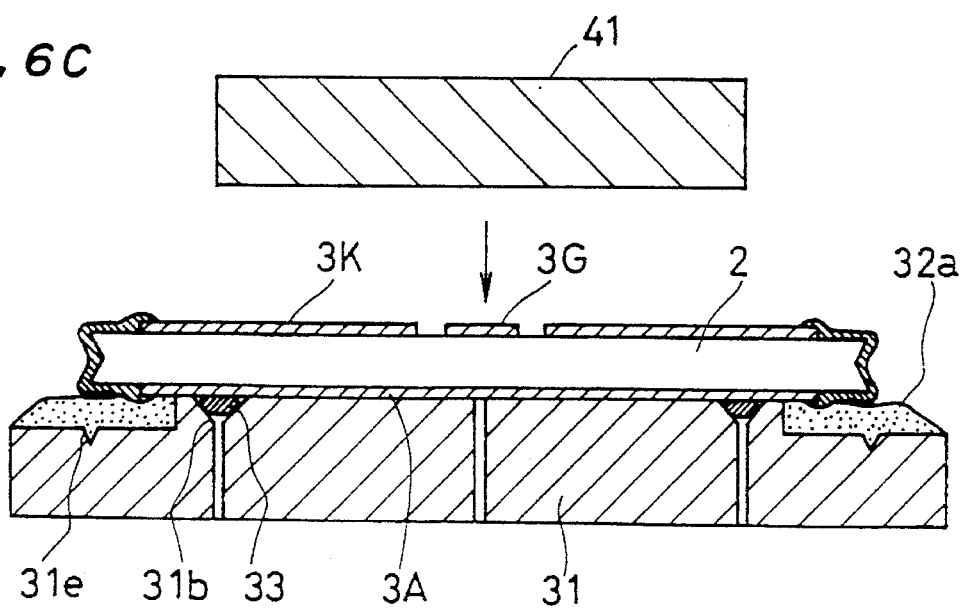

A weight 41 for preventing position shifts is placed on the semiconductor substrate 2 (FIG. 6C). There is a small clearance at that time between the upper end surface of the hardened silicone rubber 32a and the opposing lower surface of the semiconductor substrate 2.

Figure 7A:
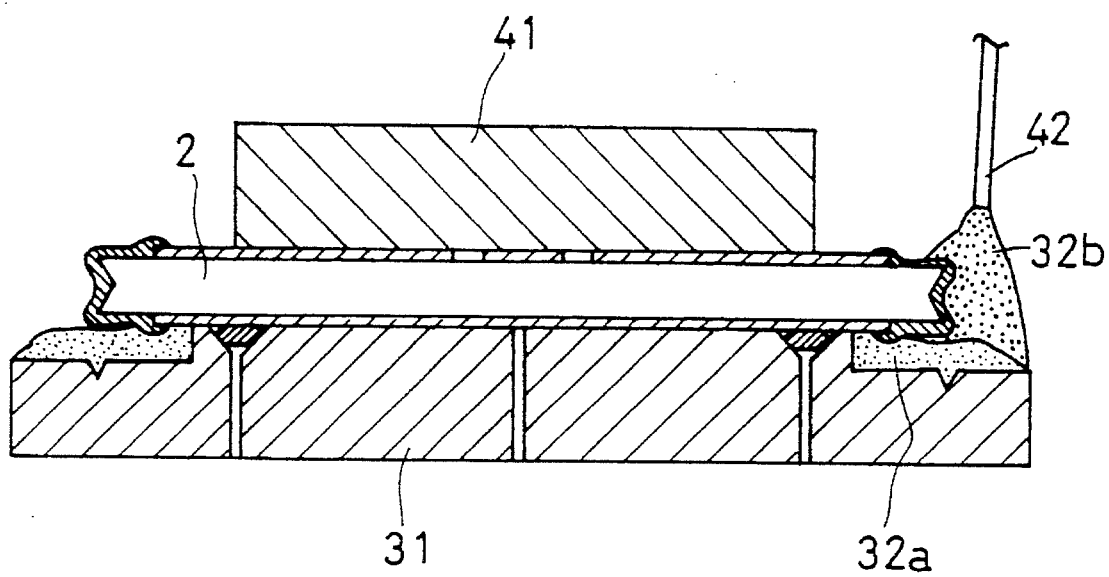

The second silicone rubber 32b is supplied from the tip of the nozzle 42 connected to the bonding retentive member supply unit (not shown) along the first silicone rubber 32a and the outer peripheral edge of the semiconductor substrate 2 to a substantial thickness (FIG. 7A). The silicone rubber 32b is applied to cover the outer peripheral edge of the semiconductor substrate 2 and its adjacent portion.

Figure 7B:
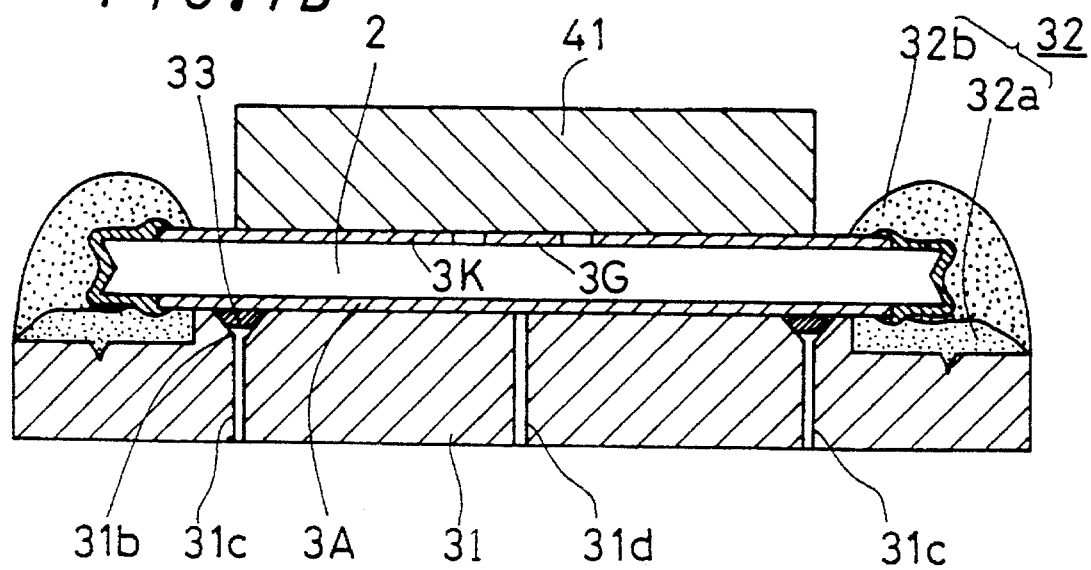

The semiconductor substrate 2 and the heat compensator 31 with the weight 41 placed thereon are inserted in the vacuum vessel and are then heated under vacuum or in inert gas to harden the silicone rubber 32b (FIG. 7B). The hardened silicone rubber 32b covers the outer peripheral edge of the semiconductor substrate 2 and its adjacent portion, as shown in FIG. 7B. The first and second silicone rubbers 32a and 32b are bonded together at their contact surfaces. Thus the outer peripheral edge of the semiconductor substrate 2 and its adjacent portion are bonded to the recess 31a with the silicone rubbers 32a and 32b.

In particular, the applied second silicone rubber 32b when heated under vacuum or in inert gas penetrates between the hardened first silicone rubber 32a and the opposing lower surface of the semiconductor substrate 2. The penetration is effectively performed in the presence of a small clearance between the hardened first silicone rubber 32a and the opposing lower surface of the semiconductor substrate 2 as described above. The penetrating silicone rubber 32b hardens as it is to bond the lower surface of the semiconductor substrate 2 adjacent its outer peripheral edge to the recess 31a together with the silicone rubber 32a. This enables the semiconductor substrate 2 to be reliably fixed on the heat compensator 31 with a substantial strength without deviation or removal.

The purpose of the two-step application and hardening of the silicone rubber 32 is to prevent the residual bubbles in the hardened silicone rubber 32. The application and hardening of the silicone rubber 32 only in a single step for bonding the outer peripheral edge of the semiconductor substrate 2 to the recess 31a without the previous application and hardening of the first silicone rubber 32a in the recess 31a would find difficulty of removing the bubbles generated in the silicone rubber 32 penetrated between the recess 31a and semiconductor substrate 2 during heating, leaving the residual bubbles in the hardened silicone rubber 32. The result is an insufficient bond strength and deterioration of the reliability of the semiconductor device 100. The application and hardening of the first silicone rubber 32a in the recess 31a without placing the semiconductor substrate 2 on the heat compensator 31 affords the preformation of the silicone rubber 32a containing no bubbles on the recess 31a. For this reason, the two-step application and hardening of the silicone rubber 32 provides for secure bonding of the semiconductor substrate to the heat compensator 31 with the silicone rubber 32 containing no bubbles.

During the heating process, the silicone rubber 32b penetrated between the first silicone rubber 32a and the lower surface of the semiconductor substrate 2 is sometimes penetrated beyond the inner periphery of the recess 31a and toward the center of the upper major surface of the heat compensator 31 between the upper end surface of the heat compensator 31 and the anode electrode layer 3A. The hardening of the silicone rubber 32b with the penetration allowed causes inadequate electrical connection between the anode electrode layer 3A and the upper major surface of the heat compensator 31, deterioration of the electrical characteristics, and damages to the semiconductor substrate 2 due to local stress concentration in the semiconductor substrate 2. The V-shaped groove 31b and the O-ring 33 are provided for the purpose of preventing the penetration. The O-ring 33 closely contacting the anode electrode layer 3A and V-shaped groove 31b to block the clearance therebetween obstructs the silicone rubber 32b penetrated beyond the inner periphery of the recess 31a toward the center, so that the silicone rubber 32b is not permitted to enter the central region surrounded by the O-ring 33. In other words, no penetration of the silicone rubber 32b occurs in the central region which occupies a large part of a region wherein the lower end surface of the semiconductor substrate 2 is at least opposed to the upper major surface of the heat compensator 31. Thus the electrical contact is ensured in the central region and no stress concentration is generated, preventing the deterioration and damage of the electrical characteristics of the semiconductor device.

Air is sometimes sealed in the clearance between the anode electrode layer 3A and the heat compensator 31 when the semiconductor substrate 2 is placed on and bonded to the heat compensator 31. As the silicone rubber 32b is heated to harden, gases are sometimes generated from the silicone rubber 32b and enter between the anode electrode layer 3A and the heat compensator 31. Bonding with the presence of air or gases causes inadequate electrical connection between the anode electrode layer 3A and the heat compensator 31. To avoid such fault, the heat compensator 31 includes the through apertures 31c communicating with the V-shaped groove 31b and the like through aperture 31d formed centrally of the heat compensator 31. The air and gases entered between the anode electrode layer 3A and the heat compensator 31 during the heating under vacuum or in inert gas are discharged by way of the through apertures.

The silicone rubber 32 and polyimide varnish 2a which have a constant elasticity when hardened are an excellent protector of the end of the semiconductor substrate 2.

(6) Referring again to FIG. 4, the anode copper block 10A having the base portion 11A around which the flange 13Ab serving as a part of the flange 13A is bonded is inserted into the casing 7 from above the heat compensator 31 with the base portion 11A located to face upward. The flanges 13Ab and 13Aa are joined together so that their outer peripheries coincide.

(7) The outer peripheral edges of the flanges 13Aa and 13Ab are bonded together by welding.

(8) An inert gas such as gaseous nitrogen or a mixed gas of gaseous nitrogen and gaseous helium is introduced into the casing 7 from the outside open end of the external gate electrode 18 to replace the air in the interior space defined by the casing 7 with the inert gas. Since the inner diameter of the external gate electrode 18 is somewhat larger than the diameter of the conductor 16 as above described, there is a clearance between the external gate electrode 18 and the conductor 16 fitted therein. The inert gas is sent to the interior space by way of the clearance.

(9) The outside open end of the external gate electrode 18 is welded and bonded to the end of the conductor 16 fitted in the external gate electrode 18 with the interior space filled with the inert gas. This provides isolation of the interior space from exterior space, the inert gas being hermetically sealed in the interior space.

The semiconductor device 100 is assembled in the steps described hereinabove.

SECOND PREFERRED EMBODIMENT

The heat compensator 31 may includes an annular groove 31f in place of the recess 31a, as shown in the cross section of FIG. 8. The annular groove 31f is formed along and concentrically with the outer periphery of the heat compensator 31. When the semiconductor substrate 2 is placed in a predetermined position concentrically on the upper end surface of the heat compensator 31, the annular groove 31f is positioned such that the inner periphery thereof is inside of the outer peripheral edge of the semiconductor substrate 2 and the outer periphery thereof is outside of the outer peripheral edge of the semiconductor substrate 2. The depth of the annular groove 31f is, for example, 0.2 to 0.3 mm. In the same manner as the first preferred embodiment, the heat compensator 31 includes the V-shaped groove 31b formed somewhat inside of the inner periphery of the annular groove 31f, the through apertures 31c, the through aperture 31d, the V-shaped groove 31c, and the thin film layer 31g formed over the heat compensator 31.

In the semiconductor device using the heat compensator 31 of the second preferred embodiment, the semiconductor substrate 2 placed on the upper major surface of the heat compensator 31 is bonded and fixed to the heat compensator 31 with silicone rubber 34. In the steps of fabricating the semiconductor device, the silicone rubber 34 is applied and hardened in two steps in the same fashion as the first preferred embodiment. Silicone rubber 34a which is part of the silicone rubber 34 to be applied first covers the annular groove 31f. Preferably, the thickness of the silicone rubber 34a is determined so that the upper surface of the finally hardened silicone rubber 34a is slightly lower than the upper major surface of the heat compensator 31. Silicone rubber 34b which is a second part of the silicone rubber 34 is applied along the hardened silicone rubber 34a, the upper major surface of the heat compensator 31 adjacent its outer periphery and the outer peripheral edge of the semiconductor substrate 2 to a substantial thickness. The other fabricating steps of the second preferred embodiment are identical with those of the first preferred embodiment.

The hardened silicone rubber 34b is formed to cover the outer peripheral edge of the semiconductor substrate 2 and its adjacent portion, as shown in FIG. 8. In particular, the silicone rubber 34b is penetrated into a slight clearance between the previously hardened silicone rubber 34a and the opposing lower surface of the semiconductor substrate 2 and is hardened to bond the lower surface of the semiconductor substrate 2 adjacent its outer peripheral edge to the upper major surface of the heat compensator 31 adjacent its outer periphery and the annular groove 31f together with the silicone rubber 34a. Thus the semiconductor substrate 2 is reliably fixed on the heat compensator 31 with a substantial strength without the danger of deviation or removal. Further, since the silicone rubber 34a containing no bubbles is previously formed in the annular groove 31f, the semiconductor substrate 2 is securely bonded to the heat compensator 31 with the silicone rubber 34 containing no bubbles.

THIRD PREFERRED EMBODIMENT

Figure 9:
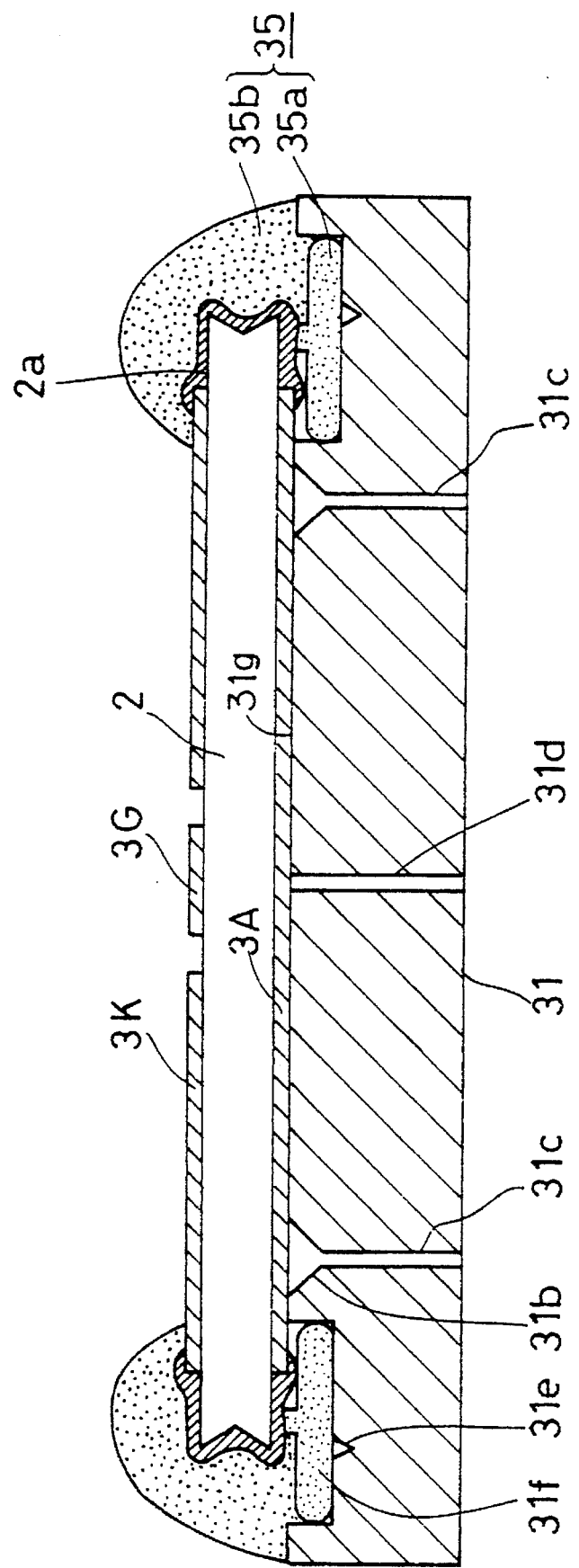
FIG. 9 is a front sectional view of a major part of the semiconductor device according to a third preferred embodiment of the present invention.

Previously formed and hardened annular silicone rubber 35a may be disposed in the annular groove 31f, as shown in the cross section of FIG. 9, in place of applying and hardening the silicone rubber 34a in the semiconductor device using the heat compensator 31 of the second preferred embodiment. The radial width of the silicone rubber 35a is substantially equal to the width of the annular groove 31f and, more preferably, the outer peripheral radius of the silicone rubber 35a is smaller than that of the annular groove 31f. The height of the body of the silicone rubber 35a is about 0.1 to 0.2 mm lower than the depth of the annular groove 31f. The silicone rubber 35a includes a projection over the upper surface of its body. The projection is formed such that, when the silicone rubber 35a is formed in the annular groove 31f, the projection is inside of the outer peripheral edge of the semiconductor substrate 2 placed in position and the upper end surface of the projection contacts the lower major surface of the semiconductor substrate 2. Silicone rubber 35b is formed along the silicone rubber 35a, the upper major surface of the heat compensator 31 adjacent its outer periphery and the outer peripheral edge of the semiconductor substrate 2 to a substantial thickness.

Figure 10A:
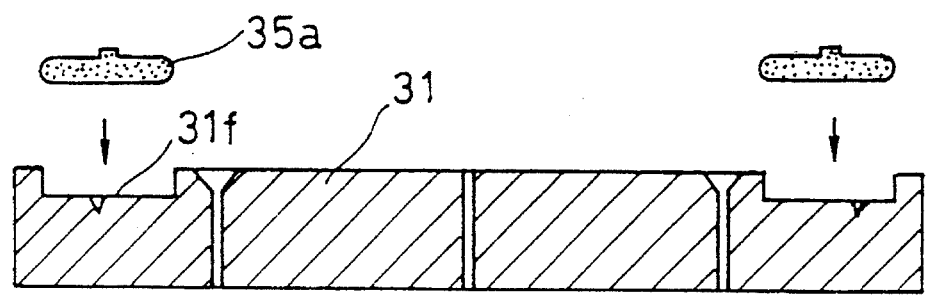
FIGS. 10A to 10C, 11A, and 11B show the steps of fabricating the semiconductor device of the third preferred embodiment.

In the third preferred embodiment, the step of fixing the semiconductor substrate 2 on the heat compensator 31 is carried out as shown in FIGS. 10A to 10C, 11A and 11B. The heat compensator 31 is initially placed on a horizontal table (not shown), with the annular groove 31f side located to face upward. Then the silicone rubber 35a which has been hardened and formed is disposed in the annular groove 31f (FIG. 10A).

Figure 10B:
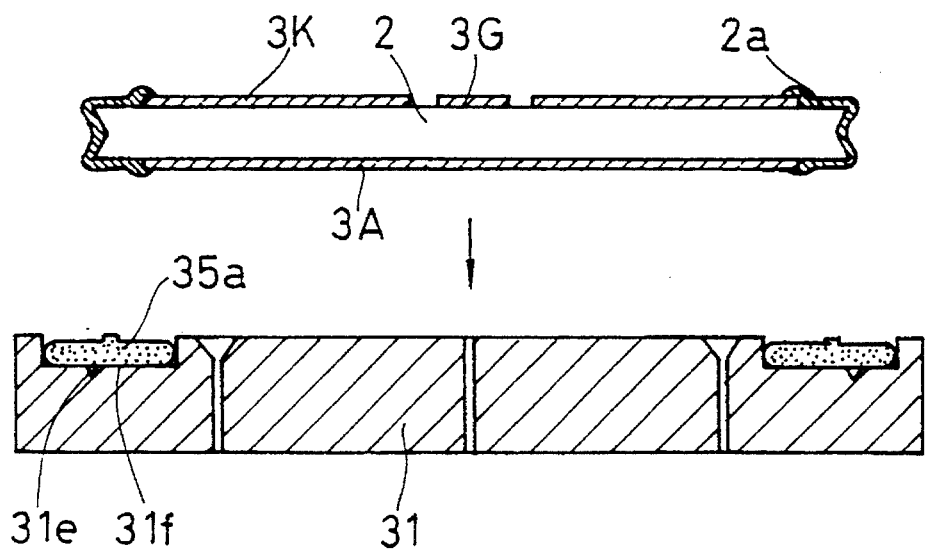

The semiconductor substrate 2 is placed on the heat compensator 31 centrally thereof, with the face of the anode electrode layer 3A of the semiconductor substrate 2 positioned downside (FIG. 10B). At that time, while the V-shaped groove 31e is visually confirmed through the silicone rubber 35a, the semiconductor substrate 2 is placed so that the outer peripheral edge of the semiconductor substrate 2 is located just above the V-shaped groove 31e.

Figure 10C:
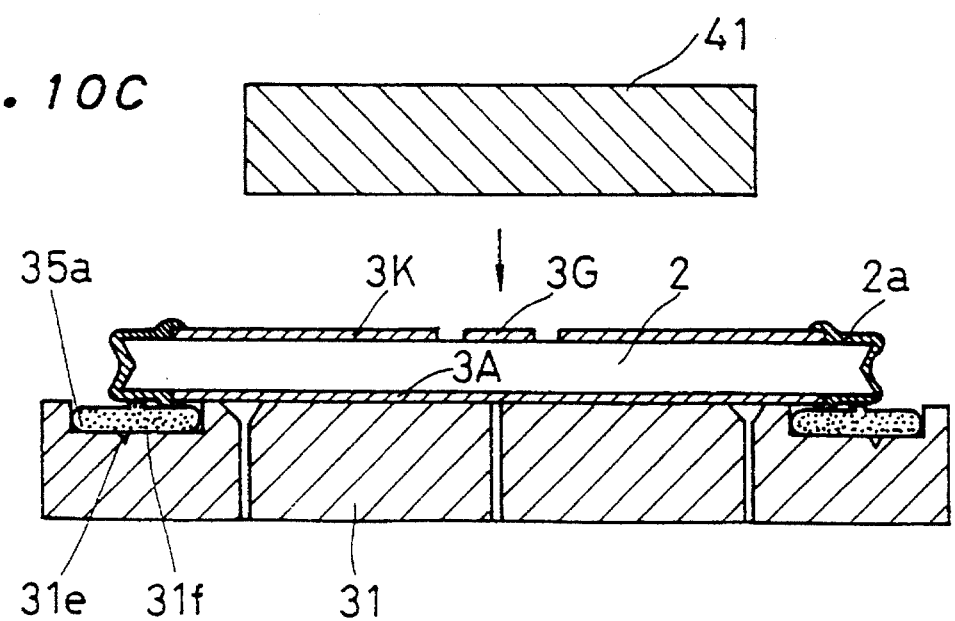

The weight 41 for preventing position shifts is placed on the semiconductor substrate 2 (FIG. 10C). There is a small clearance between the upper end surface of the body of the silicone rubber 35a and the opposing lower surface of the semiconductor substrate 2. The upper end surface of the projection of the silicone rubber 35a is in contact with the lower major surface of the semiconductor substrate 2, for example the surface of the anode electrode layer 3A or polyimide varnish 2a.

Figure 11A:
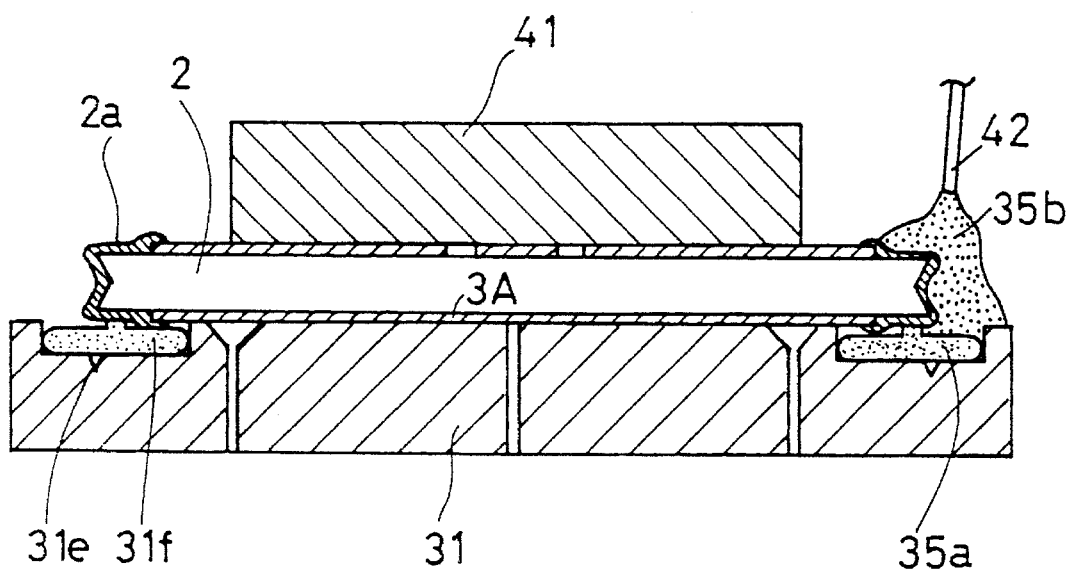

The silicone rubber 35b is supplied from the tip of the nozzle 42 along the silicone rubber 35a and the outer peripheral edge of the semiconductor substrate 2 to a substantial thickness (FIG. 11A). The silicone rubber 35b is applied to cover the outer peripheral edge of the semiconductor substrate 2 and its adjacent portion.

Figure 11B:
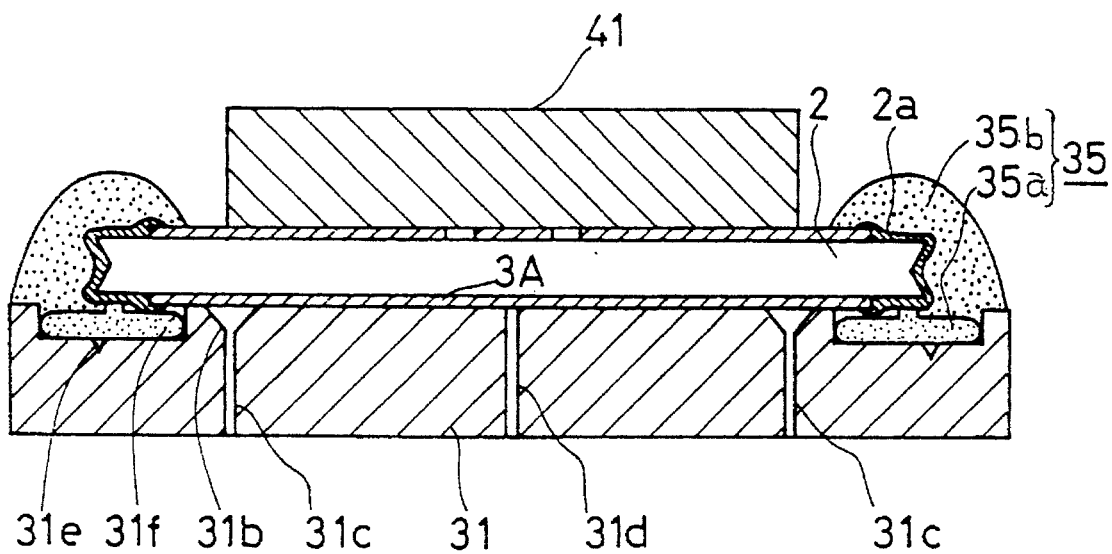

Subsequently, the semiconductor substrate 2 and the heat compensator 31 with the weight 41 placed thereon are inserted into the vacuum vessel and are then heated under vacuum or in inert gas to harden the silicone rubber 35b (FIG. 11B). Some of the silicone rubber 35b penetrates between the silicone rubber 35a and the annular groove 31f. The penetration is effectively performed if the outer diameter of the silicone rubber 35a is smaller than the outer diameter of the annular groove 31f. Further, since the small clearance is present between the body of the silicone rubber 35a and the opposing lower surface of the semiconductor substrate 2 as above described, the applied silicone rubber 35b is effectively penetrated in the clearance. However, the silicone rubber 35b is not penetrated beyond the projection of the silicone rubber 35a contacting the lower major surface of the semiconductor substrate 2 toward the central region of the heat compensator 31. For this reason, the O-ring 33 need not be provided in the third preferred embodiment. The silicone rubber 35b is hardened by heating as it is penetrated in these portions. The hardened silicone rubber 35b is formed to cover the outer peripheral edge of the semiconductor substrate 2 and its adjacent portion, as shown in FIG. 11B. Thus the semiconductor substrate 2 is reliably fixed on the heat compensator 31 with a substantial strength without deviation or removal. Since the preformed silicone rubber 35a containing no bubbles is previously disposed in the annular groove 31f, the semiconductor substrate 2 is securely bonded to the heat compensator 31 with the silicone rubber 35 containing no bubbles. The use of the formed workpiece facilitates the step of filling the annular groove 31f with the silicone rubber.

FOURTH PREFERRED EMBODIMENT

Figure 12:
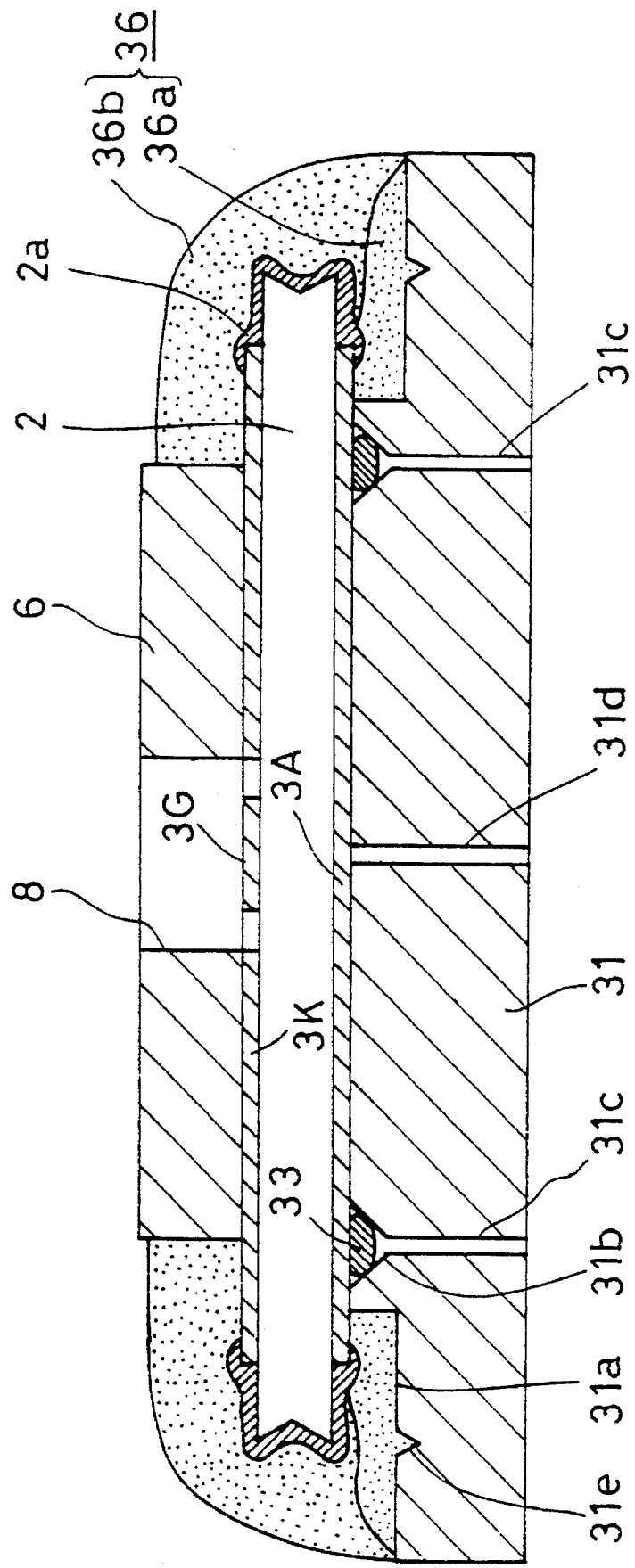
FIG. 12 is a front sectional view of a major part of the semiconductor device according to a fourth preferred embodiment of the present invention.

The press-pack type semiconductor device of the present invention may be constructed such that silicone rubber 36 adjacent the outer peripheral edge of the semiconductor substrate 2 fixes together not only the semiconductor substrate 2 and heat compensator 31 but also the heat compensator 6, as shown in FIG. 12.

Figure 13A:
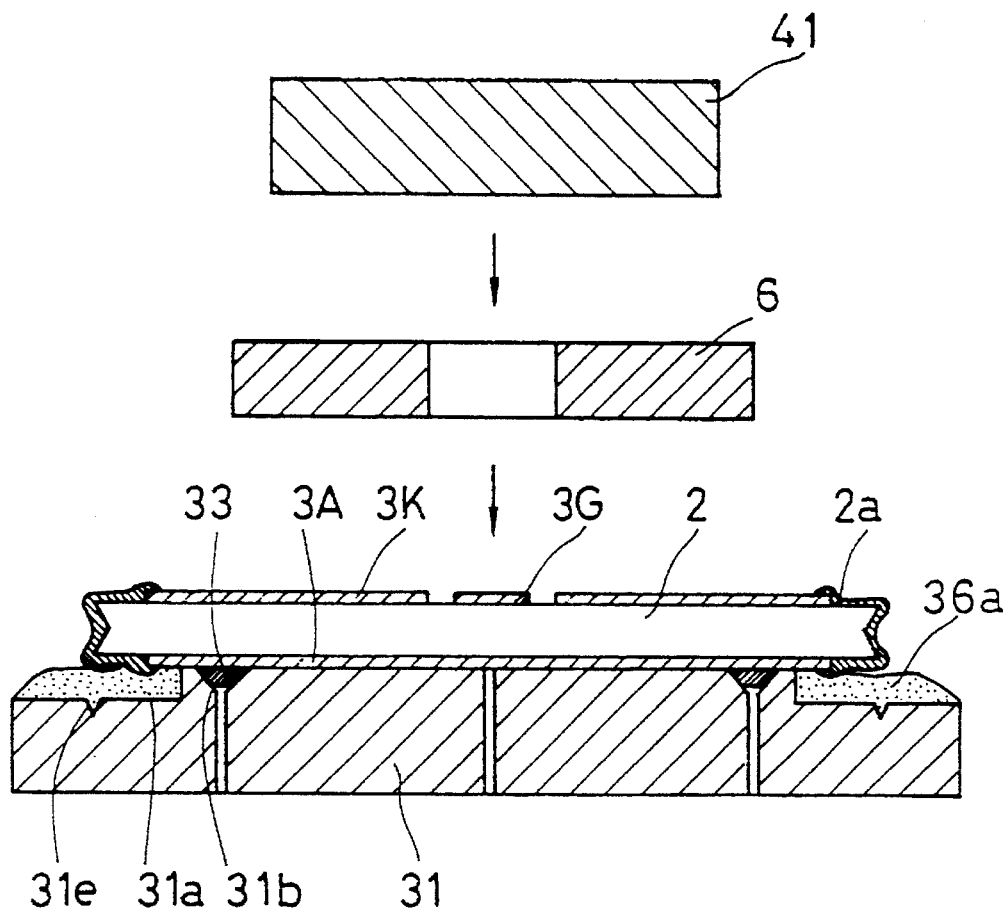
FIGS. 13A, 13B, and 14 show the steps of fabricating the semiconductor device of the fourth preferred embodiment.
Figure 13B:
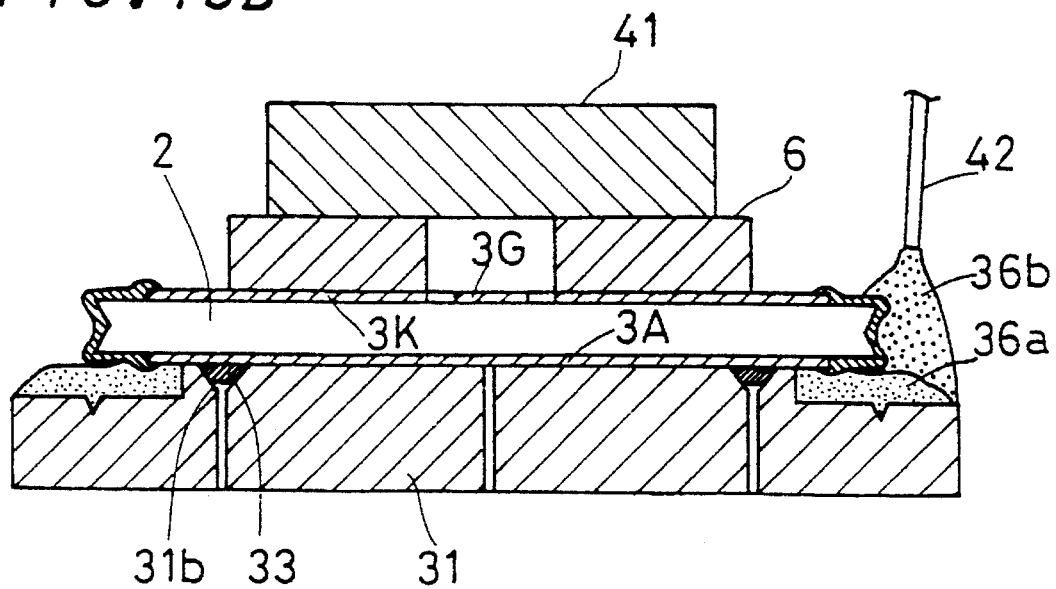
Figure 14:
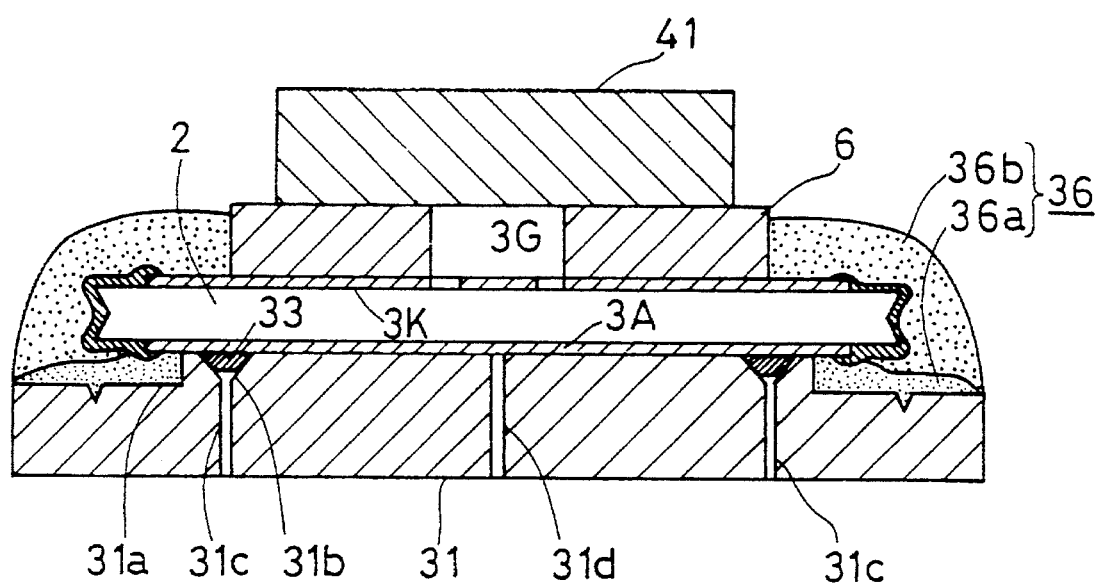

In the fourth preferred embodiment, the step of fixing the semiconductor substrate 2 on the heat compensator 31 includes steps as shown in FIGS. 13A, 13B and 14. That is, after the same steps as shown in FIGS. 6A and 6B, the heat compensator 6 is placed on the upper major surface of the semiconductor substrate 2 concentrically in position, and the weight 41 is placed thereon (FIG. 13A). Preferably, there is a slight spacing between the upper end surface of hardened silicone rubber 36a and the opposing surface of the anode electrode layer 3A.

Then silicone rubber 36b is supplied from the tip of the nozzle 42 along the silicone rubber 36a and the outer peripheral edge of the semiconductor substrate 2 to a substantial thickness (FIG. 13B). The silicone rubber 36b is applied to cover the outer peripheral edge of the semiconductor substrate 2, its adjacent portion, the outer peripheral side face of the heat compensator 6 except about its upper end, and the silicone rubber 36a.

The semiconductor substrate 2 and the heat compensator 31 with the weight 41 placed thereon are inserted into the vacuum vessel, and are heated under vacuum or in inert gas to harden the silicone rubber 36b (FIG. 14). The silicone rubber 36b is penetrated between the upper end surface of the silicone rubber 36a and the opposing lower surface of the semiconductor substrate 2 adjacent its outer peripheral edge. The silicone rubber 36b penetrated into this portion is hardened by heating as it is. The hardened silicone rubber 36b is formed over the outer peripheral side face of the heat compensator 6 except about its upper end, the outer peripheral edge of the semiconductor substrate 2 its adjacent portion and the silicone rubber 36a. Thus the semiconductor substrate 2 is reliably fixed on the heat compensator 6 and the heat compensator 31 with a substantial strength without the danger of deviation or removal. In the fourth preferred embodiment, since not only the semiconductor substrate 2 and the heat compensator 31 but also the heat compensator 6 are fixed together, the relative position of the heat compensator 6 and the semiconductor substrate 2 is not shifted as the semiconductor device is used.

MODIFICATIONS (1) In the semiconductor device of the first, second and fourth preferred embodiments, the V-shaped groove 31b and the through apertures 31c function to prevent the silicone rubber from entering the central region without the O-ring 33. The O-ring 33 enhances the effect.

(2) A plurality of V-shaped grooves 31b may be formed in the heat compensator 31. More V-shaped grooves 31b enhance the effect of preventing the silicone rubber penetration. However, more V-shaped grooves 31b reduce the electrical contact area between the anode electrode layer 3A and the heat compensator 31, and hence an unnecessarily large number of V-shaped grooves 31b are not preferable.

(3) The cross-sectional configuration of the V-shaped groove 31b is not limited to being triangular as shown in FIG. 2 but may be varied as required.

(4) The first to fourth preferred embodiments employ the press-pack type thyristor having the center gate. The present invention is, however, not limited to thyristors but may be applied to press-pack type diodes, transistors, and other general press-pack type semiconductor devices.

While the invention has been shown and described in detail, the foregoing description is in all aspects illustrative and not restrictive. It is therefore understood that numerous modifications and variations can be devised without departing from the scope of the invention.

What is claimed is:
1. A press-pack type semiconductor device comprising:
   (a) a semiconductor substrate including
      (a-1) a semiconductor substrate body having at least one junction of different conductivity type semiconductor layers, and first and second major surfaces, and
      (a-2) first and second conductive electrode layers of flat plate shape formed on said first and second major surfaces, respectively;
   (b) a first electrically conductive heat compensator having first and second major surfaces, said first major surface of said first heat compensator contacting an outer major surface of said first electrode layer;
   (c) a second electrically conductive heat compensator having first and second major surfaces, said first major surface of said second heat compensator contacting the outer major surface of said second electrode layer, said second heat compensator being shaped such that its outer peripheral edge protrudes outwardly from the outer peripheral edge of said semiconductor substrate, said second heat compensator including a recess formed in said first major surface thereof, said recess having a surface retracted from said first major surface of said second heat compensator, and said recess being formed along the outer peripheral edge of said semiconductor substrate and having a predetermined width including a projected portion of the outer peripheral edge of said semiconductor substrate;
   (d) a bonding retentive material applied to said recess, the outer peripheral edge of said semiconductor substrate and its adjacent portion for fixing said outer peripheral edge of said semiconductor substrate and its adjacent portion on said second heat compensator, said bonding retentive material including
      (d-1) a first portion for filling said recess, and
      (d-2) a second portion contacting said first portion,
   (e) first and second electrically conductive blocks each having at least one major surface, said major surfaces of said first and second conductive blocks contacting said second major surfaces of said first and second heat compensators, respectively; and
   (f) housing means having two opposed openings for housing said semiconductor substrate, said first and second heat compensators, and said first and second conductive blocks in such a manner that parts of said first and second conductive blocks are exposed at said two openings, respectively, said housing means having substantially electrically insulating properties,
   the thermal expansion coefficient of said first heat compensator being closer to that of said semiconductor substrate than that of said first conductive block, and
   the thermal expansion coefficient of said second heat compensator being closer to that of said semiconductor substrate than that of said second conductive block.

2. The press-pack type semiconductor device of claim 1, wherein said second heat compensator further includes a first groove formed in said first major surface thereof.

3. The press-pack type semiconductor device of claim 1, wherein
   said first and second conductive blocks are made substantially of copper; and
   said bonding retentive material also fixes said first heat compensator to said second heat compensator.

4. The press-pack type semiconductor device of claim 2, wherein said second heat compensator further includes a plurality of through holes formed in said first groove and passing through to said second major surface thereof.

5. The press-pack type semiconductor device of claim 2, further comprising:
(g) an elastic ring disposed in said first groove in contact with said first groove and the outer major surface of said second electrode layer, said first groove being formed inside the inner periphery of said recess along said recess.

6. The press-pack type semiconductor device of claim 3, wherein
said second heat compensator further includes a second groove formed in the bottom of said recess along said projected portion.

7. The press-pack type semiconductor device of claim 3, wherein
said second heat compensator further includes an aperture formed in said first major surface thereof inside of the inner periphery of said recess and passing through to said second major surface thereof.

8. The press-pack type semiconductor device of claim 2, wherein
said second heat compensator comprises:
(c-1) a thin film layer for covering the surface, said thin film layer being made of an electrically conductive metal softer than a material of the inner portion of said second heat compensator covered thereby.

9. A press-pack type semiconductor device comprising:
(a) a semiconductor substrate including
(a-1) a semiconductor substrate body having at least one junction of different conductivity type semiconductor layers, and first and second major surfaces, and
(a-2) first and second conductive electrode layers of flat plate shape formed on said first and second major surfaces, respectively;
(b) a first electrically conductive heat compensator having first and second major surfaces, said first major surface of said first heat compensator contacting an outer major surface of said first electrode layer;
(c) a second electrically conductive heat compensator having first and second major surfaces, said first major surface of said second heat compensator contacting an outer major surface of said second electrode layer, said second heat compensator being shaped such that its outer peripheral edge protrudes outwardly from an outer peripheral edge of said semiconductor substrate, said second heat compensator including a recess formed in said first major surface thereof, said recess having a surface retracted from said first major surface of said second heat compensator, and said recess being formed along the outer peripheral edge of said semiconductor substrate and having a predetermined width including a projected portion of the outer peripheral edge of said semiconductor substrate;
(d) a bonding retentive material applied to said recess, the outer peripheral edge of said semiconductor substrate, its adjacent portion, and the outer periphery of said first heat compensator for fixing together the outer peripheral edge of said semiconductor substrate and its adjacent portion, said first heat compensator, and said second heat compensator, and
said bonding retentive material (d) includes
(d-1) a first portion for filling said recess, and
(d-2) a second portion contacting said first portion;
(e) first and second electrically conductive blocks, made substantially of copper, each having at least one major surface, said major surfaces of said first and second conductive blocks contacting said second major surfaces of said first and second heat compensators, respectively; and
(f) housing means having two opposed openings for housing said semiconductor substrate, said first and second heat compensators, and said first and second conductive blocks in such a manner that parts of said first and second conductive blocks are exposed at said two openings, respectively, said housing means having substantially electrically insulating properties,
the thermal expansion coefficient of said first heat compensator being closer to that of said semiconductor substrate than that of said first conductive block and,
the thermal expansion coefficient of said second heat compensator being closer to that of said semiconductor substrate than that of said second conductive block.

10. The press-pack type semiconductor device of claim 2, wherein said semiconductor substrate is a power gate turn-off thyristor having a silicon substrate, an anode electrode layer, and a cathode electrode layer functioning as said semiconductor substrate body, said second electrode layer and said first electrode layer, respectively.

11. The press-pack type semiconductor device of claim 10, wherein
said first and second electrode layers are made substantially of aluminum.

12. The press-pack type semiconductor device of claim 11, wherein
said first and second heat compensators are made substantially of molybdenum.

13. The press-pack type semiconductor device of claim 12, wherein
said bonding retentive material is made substantially of silicone rubber.

14. The press-pack type semiconductor device of claim 13, wherein
said housing means includes:
(f-1) a cylindrical casing made substantially of ceramic; and
(f-2) a pair of flanges fixed to opposite ends of said cylindrical casing, respectively, and having said openings, said first and second conductive blocks being exposed at said openings.

15. The press-pack type semiconductor device of claim 14, wherein
said power gate turn-off thyristor further includes:
(a-3) a gate electrode layer formed on said first major surface of said silicon substrate, said press-pack type semiconductor device further comprising:
(g) an external gate electrode formed exterior of said housing means; and
(h) gate voltage transmitting means for electrically connecting said gate electrode layer with said external gate electrode.

16. The press-pack type semiconductor device of claim 15, wherein
said first heat compensator includes a gate voltage transmitting through aperture formed in a position facing said gate electrode layer and passing through said first heat compensator from said first major surface to said second major surface thereof,
said first conductive block includes, in its major surface contacting said first heat compensator, a recess facing said gate voltage transmitting through aperture, and said gate voltage transmitting means includes:
(h-1) a gate electrode located inside of said gate voltage transmitting through aperture and contacting and connected electrically to said gate electrode layer;
(h-2) urging means located between the bottom of said recess and said gate electrode for pressing and urging said gate electrode toward said gate electrode layer; and
(h-3) a conductor having a first end connected to said gate electrode and a second end connected to said external gate electrode.

17. A heat compensator for use in the press-pack type semiconductor device recited in claim 2 as said second heat compensator, said heat compensator comprising:
(a) an electrically conductive heat compensator body having first and second major surfaces and having a thermal expansion coefficient closer to that of semiconductor than copper does,
said heat compensator body including: an annular recess formed in said first major surface thereof with a first predetermined width having a bottom retracted from said first major surface thereof and; a first groove formed in said first major surface inside of the inner periphery of said recess along said recess; plurality of first apertures formed in said first groove and extending through to said second major surface thereof; a second annular groove formed in the body, said thin film layer being made of a metal softer than said heat compensator body.

18. A press-pack type semiconductor device comprising:
(a) a semiconductor substrate including
(a-1) a semiconductor substrate body having at least one junction of different conductivity type semiconductor layers, and first and second major surfaces, and
(a-2) first and second conductive electrode layers of flat plate shape formed on said first and second major surfaces respectively;
(b) a first electrically conductive heat compensator having first and second major surfaces, said first major surface of said first heat compensator contacting an outer major surface of said first electrode layer;
(c) a second electrically conductive heat compensator having first and second major surfaces, said first major surface of said second heat compensator contacting an outer major surface of said second electrode layer, said second heat compensator being shaped such that its outer peripheral edge protrudes outwardly from an outer peripheral edge of said semiconductor substrate, said second heat compensator including a recess formed in said first major surface thereof, said recess having a surface retracted from said first major surface of said second heat compensator, and said recess being formed along the outer peripheral edge of said semiconductor substrate and having a predetermined width including a projected portion of the outer peripheral edge of said semiconductor substrate;
(d) a bonding retentive material applied to said recess, the outer peripheral edge of said semiconductor substrate and its adjacent portion for fixing said outer peripheral edge of said semiconductor substrate and its adjacent portion on said second heat compensator;
(e) first and second electrically conductive blocks each having at least one major surface, said major surfaces of said first and second conductive blocks contacting said second major surfaces of said first and second heat compensators, respectively; and
(f) housing means having two opposed openings for housing said semiconductor substrate, said first and second heat compensators, and said first and second conductive blocks in such a manner that parts of said first and second conductive blocks are exposed at said two openings, respectively, said housing means having substantially electrically insulating properties,
the thermal expansion coefficient of said first heat compensator being closer to that of said semiconductor substrate than that of said first conductive block, and
the thermal expansion coefficient of said second heat compensator being closer to that of said semiconductor substrate than that of said second conductive block.

19. The press-pack type semiconductor device of claim 18, wherein said second heat compensator further includes a first groove formed in said first major surface thereof inside an inner periphery of said recess along said recess.

20. A press-pack type semiconductor device comprising:
(a) a semiconductor substrate including
(a-1) a semiconductor substrate body having at least one junction of different conductivity type semiconductor layers, and first and second major surfaces, and
(a-2) first and second conductive electrode layers of flat plate shape formed on said first and second major surfaces, respectively;
(b) a first electrically conductive heat compensator having first and second major surfaces, said first major surface of said first heat compensator contacting an outer major surface of said first electrode layer;
(c) a second electrically conductive heat compensator having first and second major surfaces, said first major surface of said second heat compensator contacting an outer major surface of said second electrode layer, said second heat compensator being shaped such that its outer peripheral edge protrudes outwardly from an outer peripheral edge of said semiconductor substrate, said second heat compensator including a recess formed in said first major surface thereof, said recess having a surface retracted from said first major surface of said second heat compensator, and said recess being formed along the outer peripheral edge of said semiconductor substrate and having a predetermined width including a projected portion of the outer peripheral edge of said semiconductor substrate;
(d) a bonding retentive material applied to said recess, the outer peripheral edge of said semiconductor substrate, its adjacent portion, and the outer periphery of said first heat compensator for fixing together the outer peripheral edge of said semiconductor substrate and its adjacent portion, said first heat compensator, and said second heat compensator;
(e) first and second electrically conductive blocks, made substantially of copper, each having at least one major surface, said major surfaces of said first and second conductive blocks contacting said second major surfaces of said first and second heat compensators, respectively; and
(f) housing means having two opposed openings for housing said semiconductor substrate, said first and second heat compensators, and said first and second conductive blocks in such a manner that parts of said first and second conductive blocks in such a manner that parts of said first and second conductive blocks are exposed at said two openings, respectively, said housing means having substantially electrically insulating properties, the thermal expansion coefficient of said first heat compensator being closer to that of said semiconductor substrate than that of said first conductive block, and the thermal expansion coefficient of said second heat compensator being closer to that of said semiconductor substrate than that of said second conductive block.

21. The press-pack type semiconductor device of claim 20, wherein said second heat compensator further includes a first groove formed in said first major surface thereof inside an inner periphery of said recess along said recess.

22. A press-pack type semiconductor device comprising:
(a) a semiconductor substrate including
(a-1) a semiconductor substrate body having at least one junction of different conductivity type semiconductor layers, and first and second major surfaces, and
(a-2) first and second conductive electrode layers of flat plate shape formed on said first and second major surfaces respectively;
(b) a first electrically conductive heat compensator having first and second major surfaces, said first major surface of said first heat compensator contacting an outer major surface of said first electrode layer;
(c) a second electrically conductive heat compensator having first and second major surfaces, said first major surface of said second heat compensator contacting an outer major surface of said second electrode layer, said second heat compensator being shaped such that its outer peripheral edge protrudes outwardly from an outer peripheral edge of said semiconductor substrate, said second heat compensator including a first groove and a recess formed in said first major surface thereof, said recess having a surface retracted from said first major surface of said second heat compensator, and said recess being formed along the outer peripheral edge of said semiconductor substrate and having a predetermined width including a projected portion of the outer peripheral edge of said semiconductor substrate;
(d) a bonding retentive material applied to said recess, the outer peripheral edge of said semiconductor substrate and its adjacent portion for fixing said outer peripheral edge of said semiconductor substrate and its adjacent portion on said second heat compensator;
(e) first and second electrically conductive blocks each having at least one major surface, said major surfaces of said first and second conductive blocks contacting said second major surfaces of said first and second heat compensators, respectively; and
(f) housing means having two opposed openings for housing said semiconductor substrate, said first and second heat compensators, and said first and second conductive blocks in such a manner that parts of said first and second conductive blocks are exposed at said two openings, respectively, said housing means having substantially electrically insulating properties, the thermal expansion coefficient of said first heat compensator being closer to that of said semiconductor substrate than that of said first conductive block, and the thermal expansion coefficient of said second heat compensator being closer to that of said semiconductor substrate than that of said second conductive block.

23. The press-pack type semiconductor device of claim 22, wherein said second heat compensator further includes a plurality of through-holes formed in said first groove and passing through to said second major surface thereof.

24. The press-pack type semiconductor device of claim 9, wherein said second heat compensator further includes a first groove formed in said first major surface thereof inside an inner periphery of said recess along said recess.

25. A press-pack type semiconductor device comprising:
(a) a semiconductor substrate including
(a-1) a semiconductor substrate body having at least one junction of different conductivity type semiconductor layers, and first and second major surfaces, and
(a-2) first and second conductive electrode layers of flat plate shape formed on said first and second major surfaces respectively;
(b) a first electrically conductive heat compensator having first and second major surfaces, said first major surface of said first heat compensator contacting an outer major surface of said first electrode layer;
(c) a second electrically conductive heat compensator having first and second major surfaces, said first major surface of said second heat compensator contacting an outer major surface of said second electrode layer, said second heat compensator being shaped such that its outer peripheral edge protrudes outwardly from an outer peripheral edge of said semiconductor substrate, said second heat compensator including a first groove formed in said first major surface thereof;
(d) a bonding retentive material applied to said first major surface of said second heat compensator outside said first groove, the outer peripheral edge of said semiconductor substrate and its adjacent portion for fixing said outer peripheral edge of said semiconductor substrate and its adjacent portion on said second heat compensator;
(e) first and second electrically conductive blocks each having at least one major surface, said major surfaces of said first and second conductive blocks contacting said second major surfaces of said first and second heat compensators, respectively; and
(f) housing means having two opposed openings for housing said semiconductor substrate, said first and second heat compensators, and said first and second conductive blocks in such a manner that parts of said first and second conductive blocks are exposed at said two openings, respectively, said housing means having substantially electrically insulating properties, the thermal expansion coefficient of said first heat compensator being closer to that of said semiconductor substrate than that of said first conductive block, the thermal expansion coefficient of said second heat compensator being closer to that of said semiconductor substrate than that of said second conductive block, and wherein said second heat compensator further includes a plurality of through-holes formed in said first groove and passing through to said second major surface thereof.

\* \* \* \* \*

UNITED STATES PATENT AND TRADEMARK OFFICE
CERTIFICATE OF CORRECTION

PATENT NO. : 5,489,802

DATED : February 6, 1996

INVENTOR(S) : Tokumitsu SAKAMOTO et al.

Figure 15:
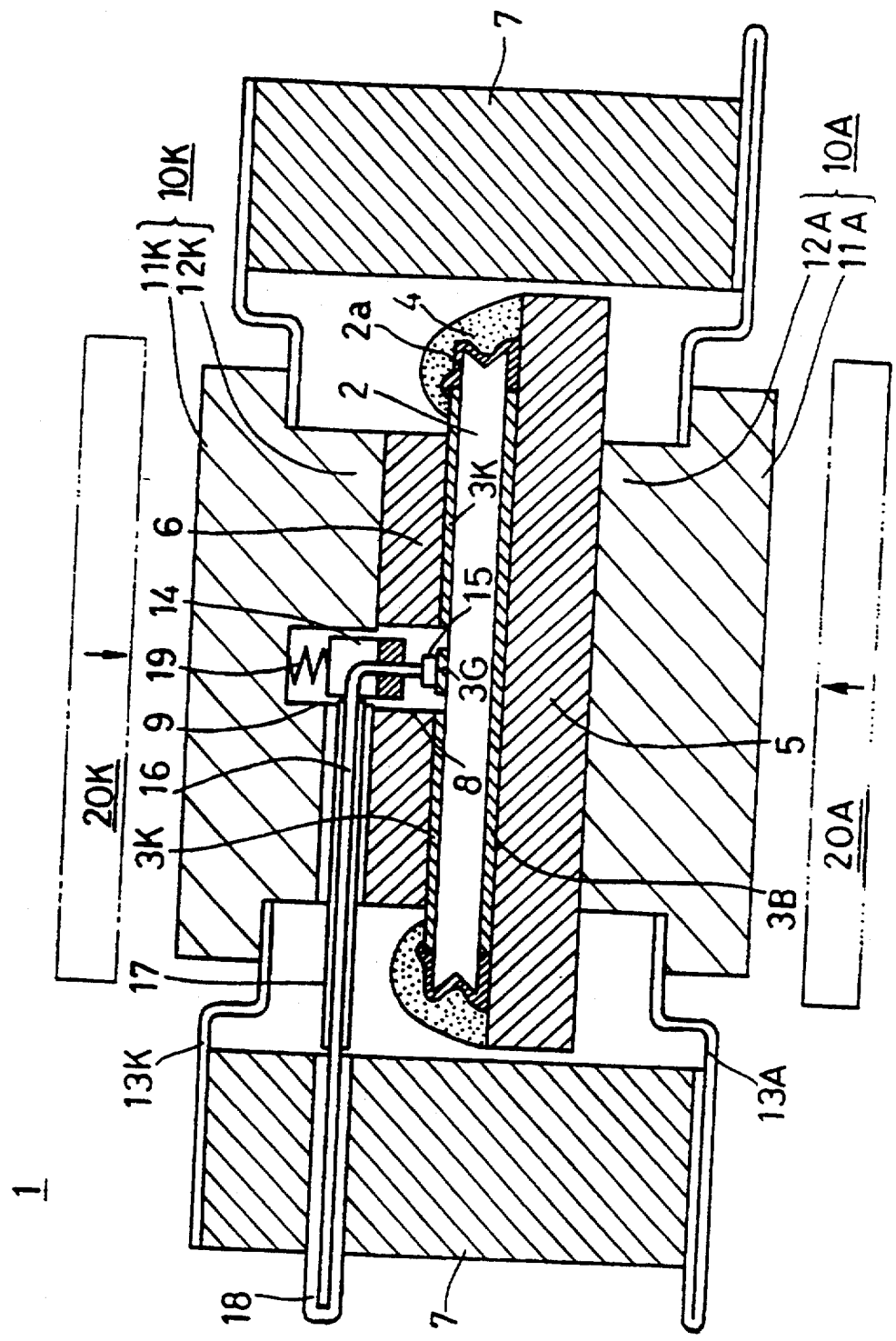
FIG. 15 is a front sectional view of a conventional press-pack type semiconductor device.
Figure 16:
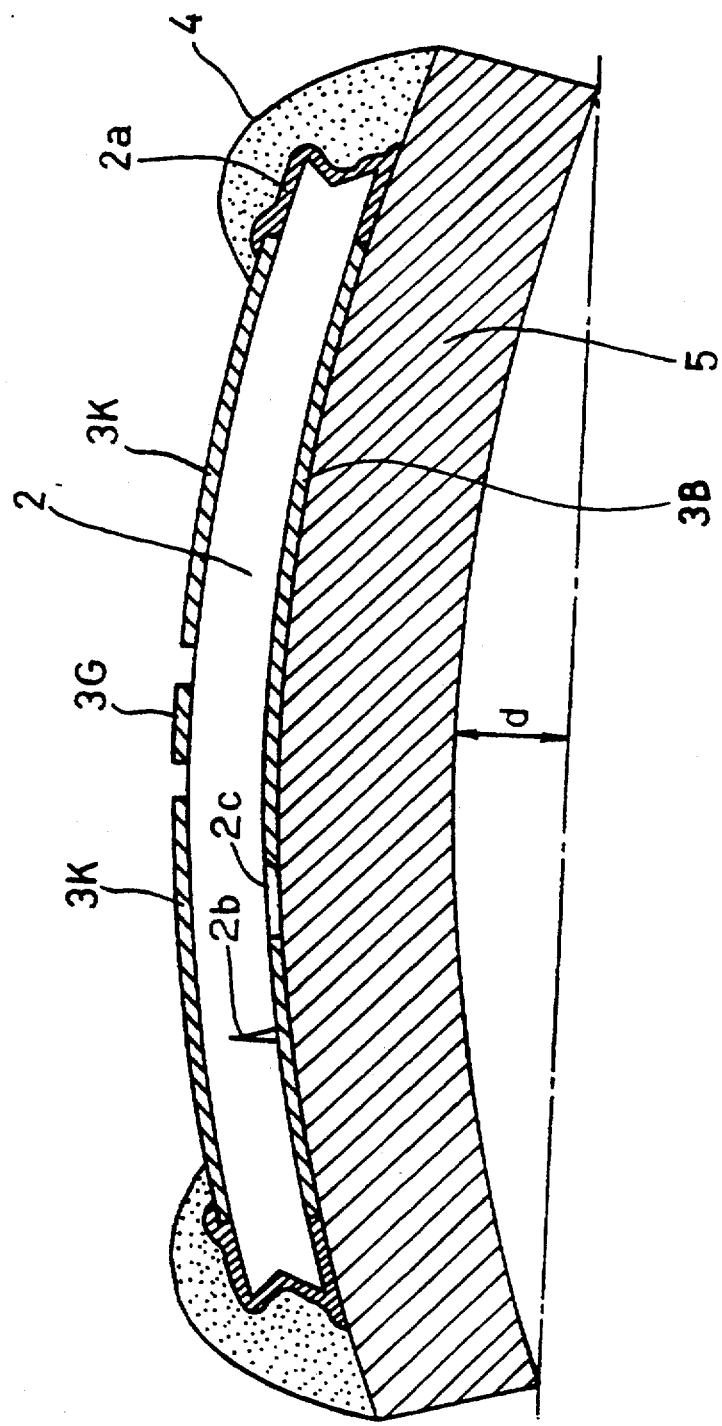
FIG. 16 is a schematic front sectional view of a major part of the conventional press-pack type semiconductor device.

It is certified that error appears in the above-indentified patent and that said Letters Patent is hereby corrected as shown below:

Figures 15 & 16 should be deleted and insert attached figs. 15 &16 to include "Prior Art"

Signed and Sealed this

Ninth Day of April, 1996

Attest:

BRUCE LEHMAN

Attesting Officer

Commissioner of Patents and Trademarks